(12) United States Patent  
Keshavan et al.

(10) Patent No.: US 10,452,799 B1  
(45) Date of Patent: Oct. 22, 2019

(54) SYSTEM AND METHOD FOR ELECTRONIC DESIGN SPACE TUNING

(71) Applicant: Cadence Design Systems, Inc., San Jose, CA (US)

(72) Inventors: Kumar Chidhambara Keshavan, Medford, MA (US); Ambrish Kant Varma, Chelmsford, MA (US); Xuegang Zeng, Westborough, MA (US); Kenneth R. Willis, Matthews, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 123 days.

(21) Appl. No.: 15/677,299

(22) Filed: Aug. 15, 2017

(51) Int. Cl.
*G06F 17/50* (2006.01)

(52) U.S. Cl.
CPC .................. *G06F 17/5045* (2013.01)

(58) Field of Classification Search
USPC ................. 716/103, 104, 106, 108, 111, 113
See application file for complete search history.

(56) References Cited

U.S. PATENT DOCUMENTS

| | | | | |
|---|---|---|---|---|
| 6,826,736 | B2* | 11/2004 | Wu | G06F 17/5036 703/14 |
| 8,290,761 | B1* | 10/2012 | Singhee | G06F 17/5036 703/13 |
| 2006/0064288 | A1* | 3/2006 | Ferryanto | G06F 17/50 703/2 |
| 2008/0077892 | A1* | 3/2008 | Yamazaki | G06F 17/5045 716/113 |
| 2015/0339414 | A1* | 11/2015 | Kuo | G06F 17/5009 716/103 |

* cited by examiner

*Primary Examiner* — Brian Ngo
(74) *Attorney, Agent, or Firm* — Mark H. Whittenberger, Esq.; Holland & Knight LLP

(57) ABSTRACT

The present disclosure relates to a system and method for use with an electronic circuit design. The method may include providing, using at least one processor, an electronic design and modeling the electronic design to obtain a characteristic distribution associated with the electronic design, wherein modeling includes randomly varying one or more parameters associated with the electronic design. The method may further include identifying at least one key parameter from the modeled electronic design and reducing the electronic design only to the at least one key parameter. The method may also include in response to reducing, randomly varying the one or more parameters and re-modeling the reduced electronic design with the randomly varied one or more parameters.

17 Claims, 33 Drawing Sheets

(eye3 "eye_njn"
 (d1 "(#LVia*#CVia) ^ 0.5")
 (d2 "#len_branch1 + #len_neckdown2")
 (d3 "#len_branch1 + #len_neckdown2 +#len_branch_delta")
 (d4 "(#pkg2_cap * #pkg2_ind) ^ 0.5")
 (d5 "(#pkg1_cap * #pkg1_ind) ^ 0.5"))

(correlation
 (d1 0.0122671 )
 (d2 0.191869 )
 (d3 0.196401 )
 (d4 0.357257 )
 (d5 -0.026169 )))

(eye3 "eye_njn"

(d1 "(#LVia*#CVia) ^ 0.5")
(d2 "#len_branch1 + #len_neckdown2")
(d3 "#len_branch1 + #len_neckdown2
+#len_branch_delta")
(d4 "(#pkg2_cap * #pkg2_ind) ^ 0.5")
(d5 "(#pkg1_cap * #pkg1_ind) ^ 0.5")

(correlation
 (d1 0.0122671 )
 (d2 0.191869 )
 (d3 0.196401 )
 (d4 0.3572257 )
 (d5 -0.026169 )))

(eye3 "eye_njn"

(d1 "(#LVia*#CVia) ^ 0.5")
(d2 "#len_branch1 + #len_neckdown2")
(d3 "#len_branch1 + #len_neckdown2")

(d5 "(#pkg1_cap * #pkg1_ind) ^ 0.5")
(d6 "#sckt_branch1")
(d7 "#sckt_main1")
(d8 "#len_branch_delta")
(d9 "#len_main1 + #len_neckdown1")
(d10 "#len_branch1")

+#len_branch_delta")

(corr
  (d1 0.156273)
  (d2 0.176873)
  (d3 0.193482)
  (d5 0.0142288)
  (d6 0.124415)
  (d7 -0.150413)
  (d8 0.0537581)
  (d9 -0.0851119)
  (d10 0.154994) ) )

FIG. 24

SYSTEM AND METHOD FOR ELECTRONIC DESIGN SPACE TUNING

FIELD OF THE INVENTION

The present disclosure relates to electronic design automation (EDA), and more specifically, to a system and method for electronic design space tuning in an electronic circuit design.

DISCUSSION OF THE RELATED ART

EDA utilizes software tools that may be used in the design and analysis of numerous electronic systems such as printed circuit boards (PCBs) and integrated circuits (ICs).

SUMMARY OF INVENTION

In one or more embodiments of the present disclosure, a method is provided. The method may include providing, using at least one processor, an electronic design and modeling the electronic design to obtain a characteristic distribution associated with the electronic design, wherein modeling includes randomly varying one or more parameters associated with the electronic design. The method may further include identifying at least one key parameter from the modeled electronic design and reducing the electronic design only to the at least one key parameter. The method may also include in response to reducing, randomly varying the one or more parameters and re-modeling the reduced electronic design with the randomly varied one or more parameters.

One or more of the following features may be included. The method may also include obtaining a second characteristic distribution associated with the re-modeling. The method may also include displaying the characteristic distribution at a graphical user interface. The method may further include displaying a second characteristic distribution at the graphical user interface. In some embodiments identifying the at least one key parameter from the modeled electronic design may include identifying one or more most dominant variables from post processing data. In some embodiments, the one or more parameters may include at least one of data rate information, transmitter information, receiver information, package parasitic information, via parasitic information, main and branch trace length information, main and branch trace width information, and main and branch trace height information. The method may also include comparing the characteristic distribution to a normalized jitter noise value.

In one or more embodiments of the present disclosure, a non-transitory computer readable storage medium having stored thereon instructions, which when executed by a process result in one or more operations is provided. Operations may include providing, using at least one processor, an electronic design and modeling the electronic design to obtain a characteristic distribution associated with the electronic design, wherein modeling includes randomly varying one or more parameters associated with the electronic design. Operations may further include identifying at least one key parameter from the modeled electronic design and reducing the electronic design only to the at least one key parameter. Operations may also include in response to reducing, randomly varying the one or more parameters and re-modeling the reduced electronic design with the randomly varied one or more parameters.

One or more of the following features may be included. Operations may also include obtaining a second characteristic distribution associated with the re-modeling. Operations may also include displaying the characteristic distribution at a graphical user interface. Operations may further include displaying a second characteristic distribution at the graphical user interface. In some embodiments identifying the at least one key parameter from the modeled electronic design may include identifying one or more most dominant variables from post processing data. In some embodiments, the one or more parameters may include at least one of data rate information, transmitter information, receiver information, package parasitic information, via parasitic information, main and branch trace length information, main and branch trace width information, and main and branch trace height information. Operations may also include comparing the characteristic distribution to a normalized jitter noise value.

In one or more embodiments of the present disclosure, a system may include a computing device having at least one processor configured to receive an electronic design and model the electronic design to obtain a characteristic distribution associated with the electronic design, wherein modeling includes randomly varying one or more parameters associated with the electronic design. The at least one processor may be further configured to identify at least one key parameter from the modeled electronic design. The at least one processor may be further configured to reduce the electronic design only to the at least one key parameter and in response to reducing, to randomly vary the one or more parameters. The at least one processor may be further configured to re-model the reduced electronic design with the randomly varied one or more parameters.

One or more of the following features may be included. The at least one processor may be further configured to obtain a second characteristic distribution associated with the re-modeling. The at least one processor may be further configured to display the characteristic distribution at a graphical user interface. The at least one processor may be further configured to display a second characteristic distribution at the graphical user interface. In some embodiments, identifying the at least one key parameter from the modeled electronic design may include identifying one or more most dominant variables from post processing data. The one or more parameters may include at least one of data rate information, transmitter information, receiver information, package parasitic information, via parasitic information, main and branch trace length information, main and branch trace width information, and main and branch trace height information.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 5 is a diagram depicting an embodiment incorporating design space tuning process in accordance with the present disclosure;

FIG. 16 is a diagram depicting an embodiment incorporating design space tuning process in accordance with the present disclosure;

FIG. 24 is a diagram depicting an embodiment incorporating design space tuning process in accordance with the present disclosure;

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Figure 1:
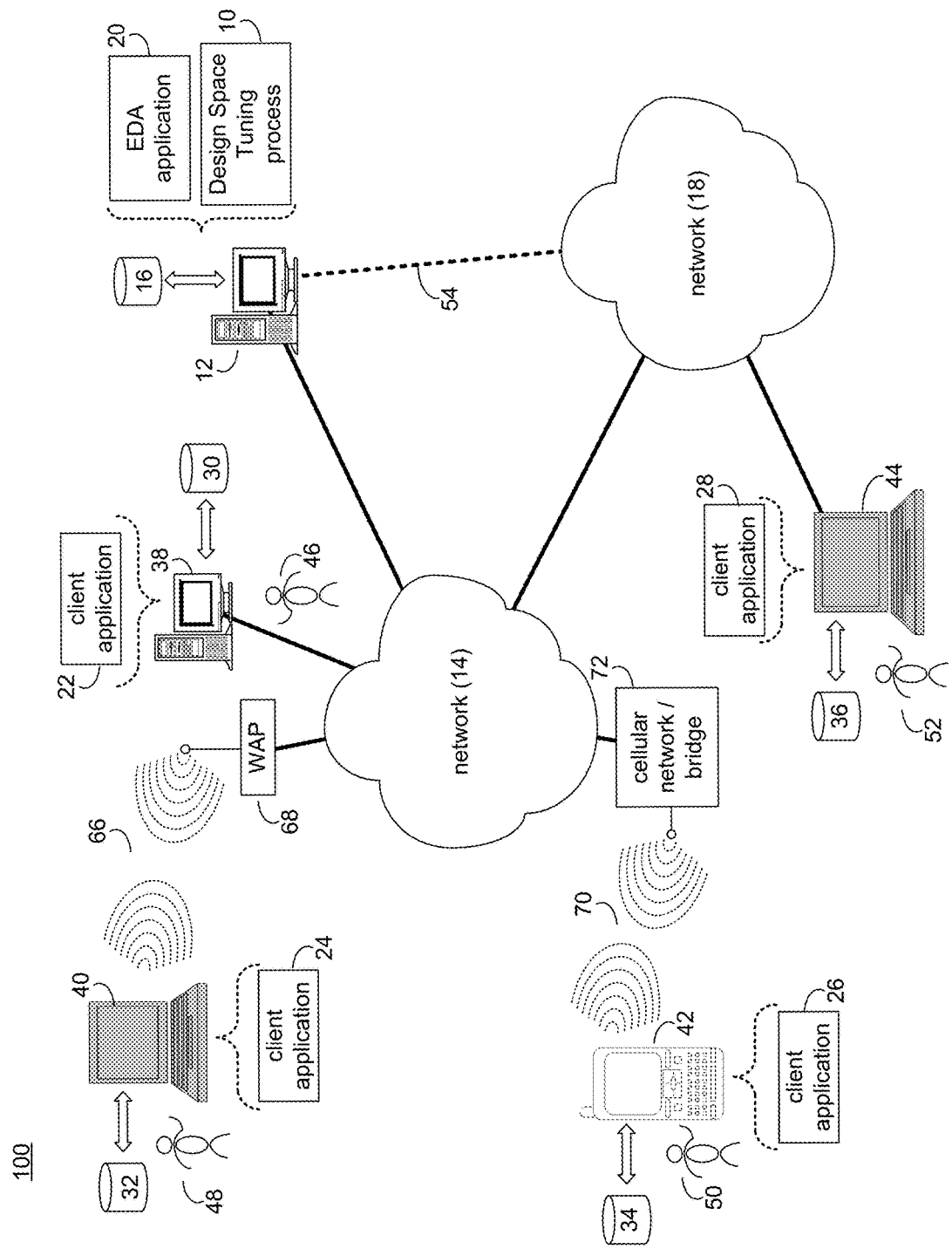
FIG. 1 is a system diagram depicting aspects of the design space tuning process in accordance with an embodiment of the present disclosure.

Referring to FIG. 1, there is shown design space tuning process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the design space tuning process may reside on and be executed, in whole or in part, by a client electronic device, such as a personal computer, notebook computer, personal digital assistant, or the like.

The instruction sets and subroutines of design space tuning process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Design space tuning process 10 may be a stand-alone application, or may be an applet/application/script that may interact with and/or be executed within EDA application 20. In addition/as an alternative to being a server-side process, the design space tuning process may be a client-side process (not shown) that may reside on a client electronic device (described below) and may interact with an EDA client application (e.g., one or more of EDA client applications 22, 24, 26, 28). Further, the design space tuning process may be a hybrid server-side/client-side process that may interact with EDA application 20 and an EDA client application (e.g., one or more of client applications 22, 24, 26, 28). As such, the design space tuning process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize design space tuning process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

As discussed above, a key challenge faced by system designers today is to determine the interconnect wiring rules for high speed signals that will ensure proper operation from a signal integrity standpoint. This involves determining appropriate operating ranges for parameters such as interconnect length, impedance, delay, crosstalk, via design, as well as connector and package selection. Adding to this complexity are the equalization capabilities typically associated with today's high speed serial link and source synchronous interfaces, which have a profound impact on the resulting signal quality. The parameters that control the equalization can easily number in the dozens, and add a significant amount of variables to be considered to the overall design. These factors make it impractical to exhaustively sweep all relevant parameters to determine the appropriate wiring rules.

Some existing techniques include Monte Carlo simulations, Design of Experiments (DOE) in combination with Response Surface Modeling (RSM), etc. Exhaustive sweeping of all possible combinations of variables is also a method, but quickly becomes impractical, as it is not uncommon for the design space to run into tens of millions of cases requiring simulation. The main cause of this computational explosion is the number of parameters associated with modern transmitters, receivers, passive elements, interconnect, and buses.

Accordingly, embodiments of the design space tuning process 10 may be configured to start with a design space and characterize it with respect to an objective function. The characterization may be the distribution of the objective function and may be obtained by sampling the design space randomly. Subsequently, the design space tuning process 10 may be configured by systematically identifying and manipulating the most sensitive parameters one at a time. As such, embodiments of the design space tuning process 10 may cut down the exploration by many factors, thus allowing the user to narrow down the most important parameters or components that need attention or analysis as is discussed in further detail herein below.

Figure 2:
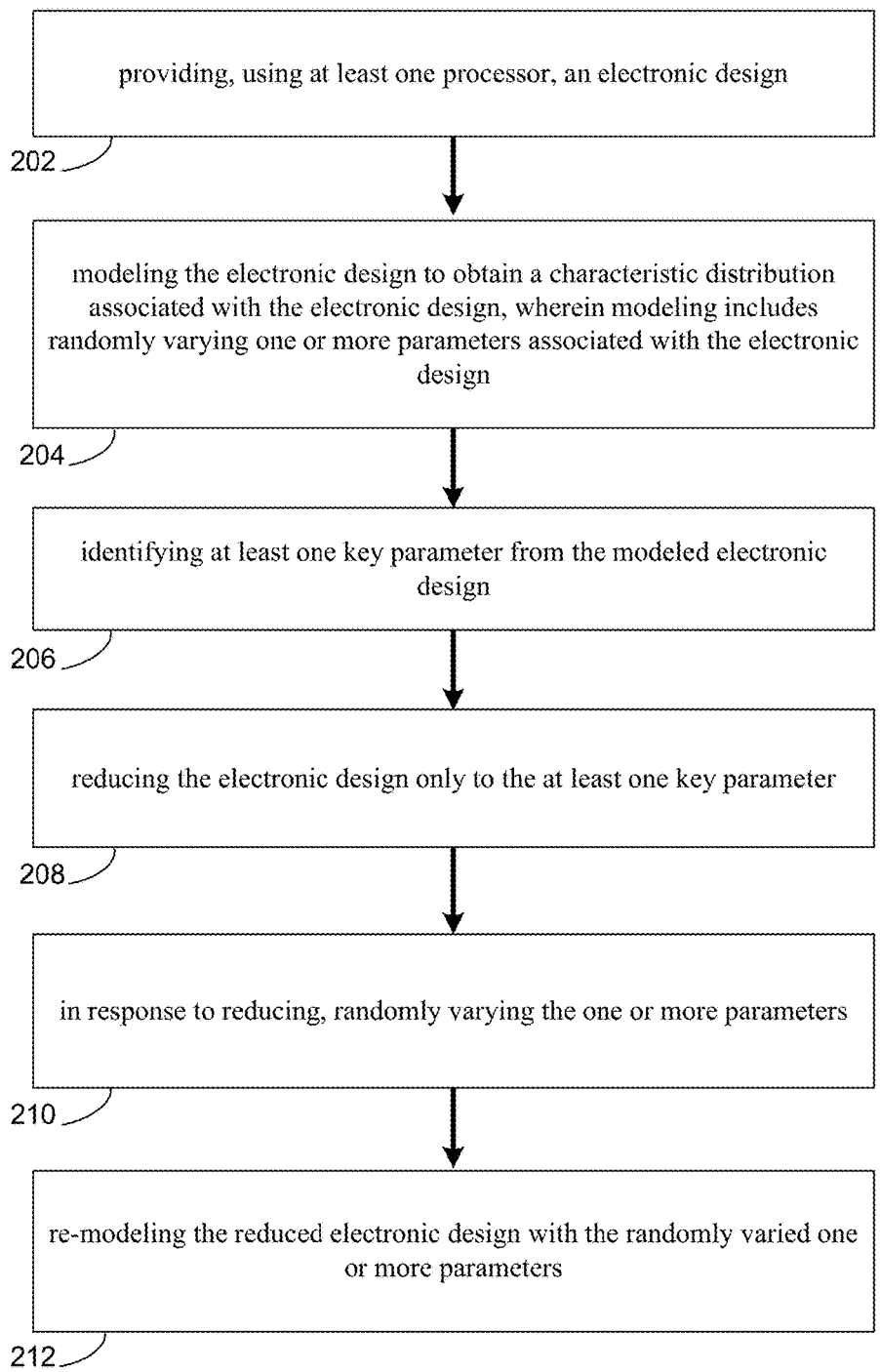
FIG. 2 is a flowchart depicting operations consistent with the design space tuning process of the present disclosure.

Referring to FIGS. 2-33, various embodiments consistent with the design space tuning process 10 are provided. As shown in FIG. 2, embodiments of the design space tuning process 10 may include providing (202), using at least one processor, an electronic design and modeling (204) the electronic design to obtain a characteristic distribution associated with the electronic design, wherein modeling includes randomly varying one or more parameters associated with the electronic design. The method may further include identifying (206) at least one key parameter from the modeled electronic design and reducing (208) the electronic design only to the at least one key parameter. The method may also include in response to reducing, randomly varying (210) the one or more parameters and re-modeling (212) the reduced electronic design with the randomly varied one or more parameters.

In some embodiments, the design space tuning process 10 may begin with a design space and may subsequently characterize it with respect to an objective function, for example eye height, eye width, or other relevant metric. The characterization may be the distribution of the objective function and may be obtained by sampling the design space randomly. Additionally and/or alternatively, the design space tuning process 10 may involve complete random data generation and statistical analysis/binning of the normalized jitter and noise value of a particular run. Embodiments included herein may recognize the centrality of the distribution as design space characterization and may also utilize a particular process by which a ranking of the most sensitive to least sensitive parameters may be identified. Embodiments of the design space tuning process 10 may be configured to automate and/or semi-automate the successive tuning of the sensitive parameters while also graphically displaying the progress as a historical evolution of the distribution.

Numerous metrics may be used in accordance with the design space tuning process 10. Some of the key metrics for collecting the distributions may include, but are not limited to, Normalized Jitter and Noise (NJN), Eye-Weighted bit error rate (BER), and BER-Weighted Eye.

In some embodiments, the design space tuning process 10 may enable the controlled evolution of the distribution. As such, the distribution may be configured to capture the most essential features of the design space in one single plot that may be easily quantified using statistical metrics. Embodiments included herein differ from expensive sensitivity analysis processes, as those approaches focus in maximizing and minimizing the local section of the design space.

Figure 3:
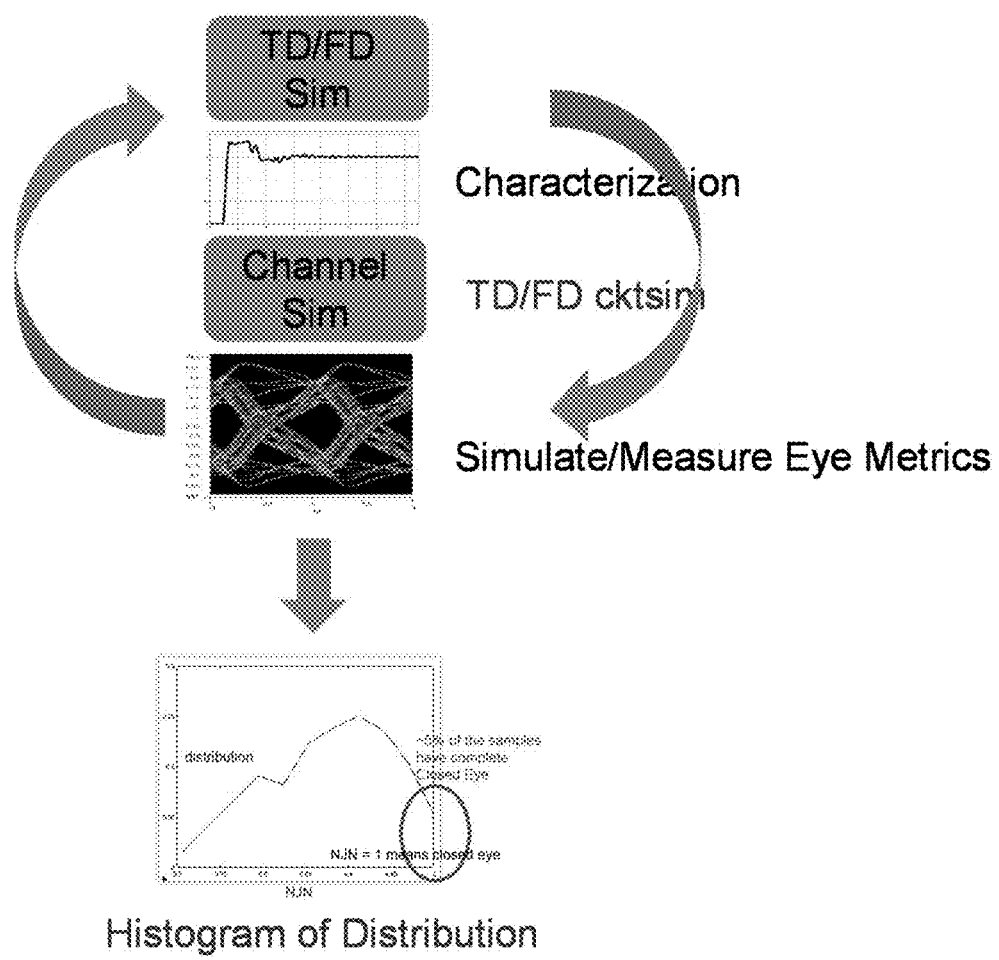
FIG. 3 is a diagram depicting an embodiment incorporating design space tuning process in accordance with the present disclosure.

Referring also to FIG. 3, a diagram 300 depicting an embodiment consistent with the design space tuning process 10 is provided. In this embodiment, circuit simulation may be utilized to produce a characterization of a circuit topology for a high speed digital interface. This characterization is provided to a convolution-based channel simulator, which produces large quantities of waveforms, which are post-processed to produce metrics. In some embodiments, design space tuning process 10 may begin with an initial modeling of any system (e.g. the system shown in FIG. 4, which is representative of a "dual data rate" DDR memory interface). This cycle may be repeated while randomly varying all the parameters/values options to obtain a characteristic distribution of the design space.

Referring also to FIG. 5, a diagram 500 depicting an embodiment consistent with the design space tuning process 10 is provided. In some embodiments, the design space tuning process 10 may be configured to identify one or more key parameters. The parameters may be identified using any suitable approach, including, but not limited to, the usage of statistical correlation analysis. This particular operation may identify the most dominant variables by post-processing data from the first initial modeling discussed above.

Figure 6:
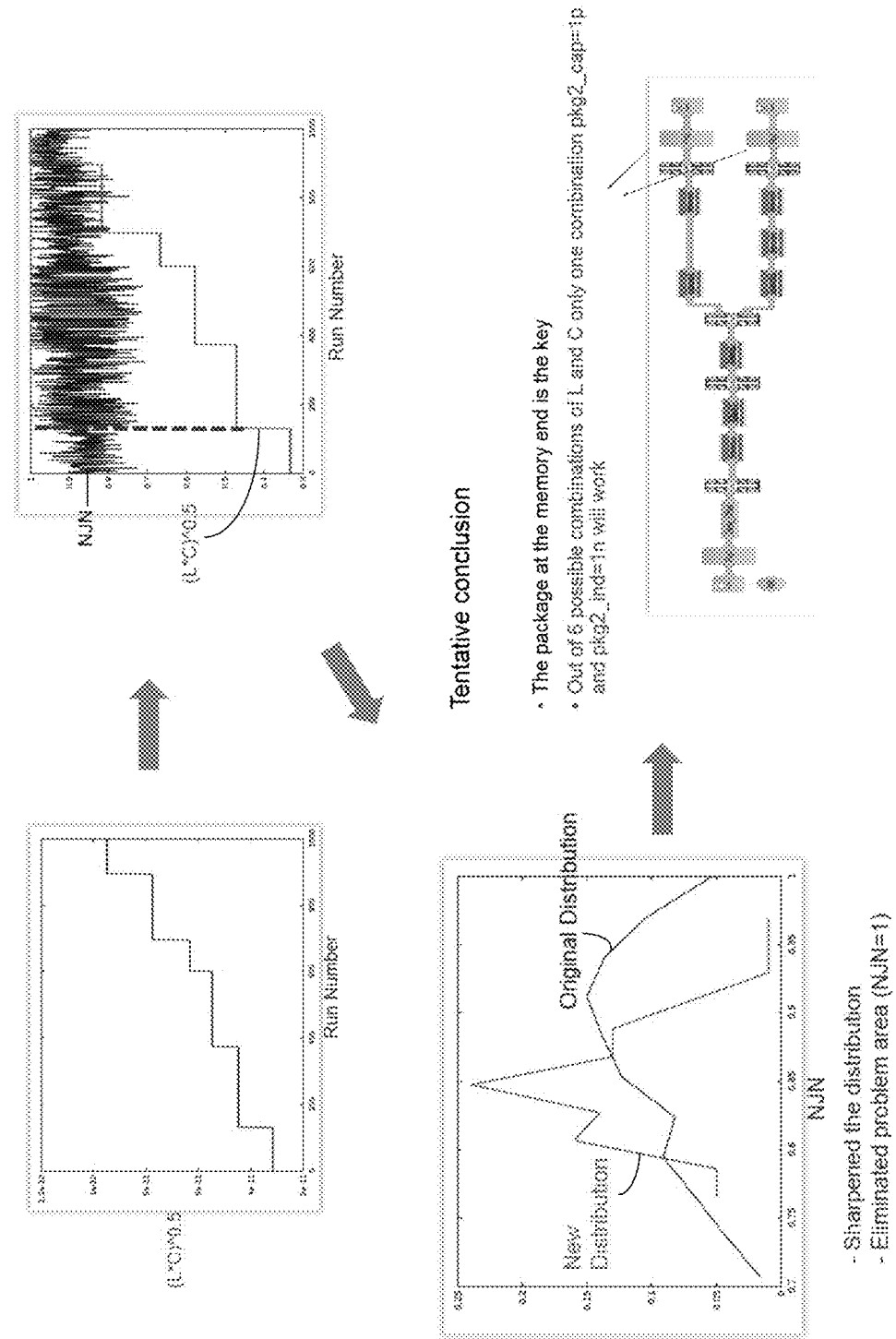
FIG. 6 is a diagram depicting an embodiment incorporating design space tuning process in accordance with the present disclosure.

Referring also to FIG. 6, a diagram 600 depicting an embodiment consistent with the design space tuning process 10 is provided. In this example, the inductance (L) and capacitance (C) package parasitics of the memory devices are varied across an initial range for simulation, while the "NJN" metric is evaluated for each simulation result. By plotting the package parasitic characteristics vs. the resulting NJN, the package parasitic combinations causing non-compliant NJN results can be identified and eliminated. Restricting these package parasitics to "good" values results in a much sharper and controlled NJN distribution, while eliminating failing NJN cases. In some embodiments, the design space tuning process 10 may be configured to constrict, reduce, and/or limit a design space of a dominant variable once it has been identified using the process above. As is shown in FIG. 6, the process may then be configured to re-run the simulations with randomly varying all parameters (within their ranges). This essentially involves similar operations to those described above with reference to FIG. 3. It should be noted that the operations described in FIGS. 6-7 may be performed automatically, for example, without requiring action on the part of the designer.

Figure 7:
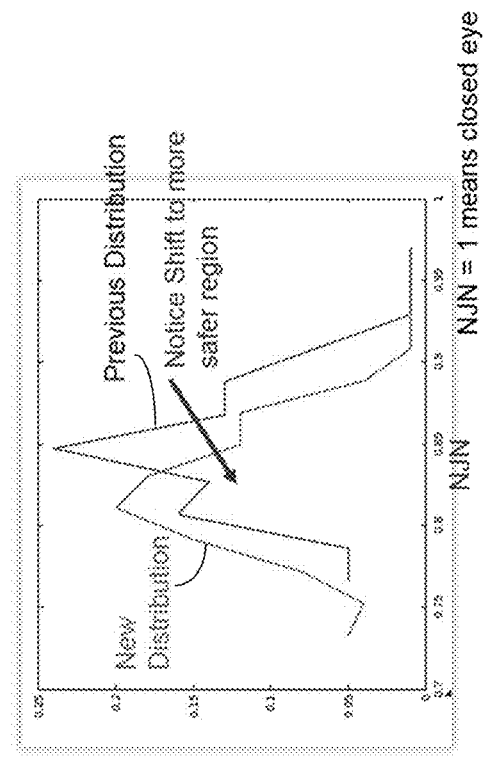
FIG. 7 is a diagram depicting an embodiment incorporating design space tuning process in accordance with the present disclosure.
Figure 7:
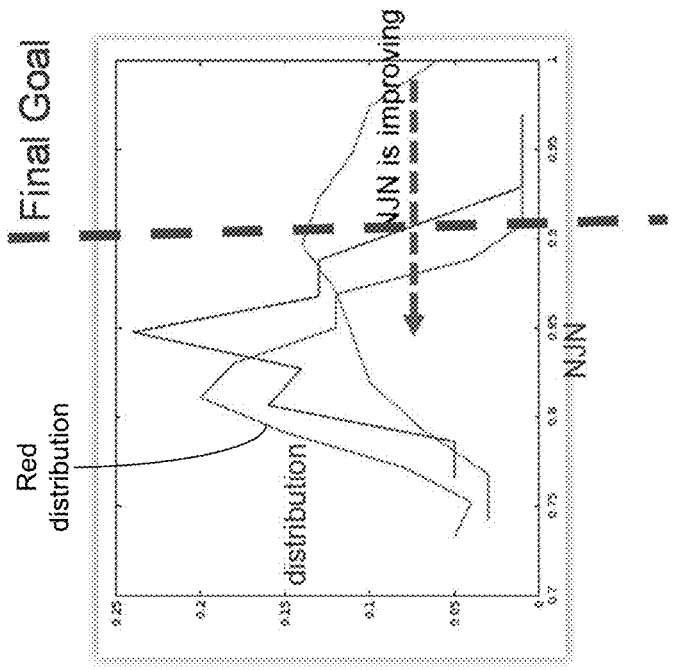

Referring also to FIG. 7, a diagram 700 depicting an embodiment consistent with the design space tuning process 10 is provided. Here, the key parameters have been identified and bounded, based on the objective function, which in this case is the NJN metric. This results in the NJN distribution being further sharpened (e.g., controlled), and the NJN distribution being shifted to the left, where the majority of cases now fall into the safe design space, with acceptable NJN metrics. In some embodiments, the design space tuning process 10 may be configured to further analyze the distribution after varying other parameters (e.g., continuing the operation of FIG. 6) and observe the evolution of the distribution of the design space. In this way, the design space tuning process 10 may be configured to recursively constrict, reduce, and/or limit the design space until the final goal is achieved. In the particular example shown in FIG. 7, the red distribution has reached the final goal in the rightmost GUI).

Referring again to FIG. 4, a diagram 400 depicting an example embodiment in accordance with design space tuning process 10 is provided. In this particular example a low power double data rate DRAM (LPDDR4) operating at 3.2 Gbps is provided. This example includes a transmitter (TX) AMI model and two separate memory banks. The parameters for this example include data rate=3.2 Gbps, Tx=DQS_PD40_ODTDIS_VOH30 (ODT disabled), Rx=CA_INPUT_ODT60_VOH30, Rx Node=Memory1, Die Pad, Signal: 48_A, Package parasitics=r_pkg, c_pkg and l_pkg, Via parasitics=r_via, c_via and l_via, main and branch trace lengths, and main and branch traces width and height (impedance). This produces a total number of combinations of 21,257,640,000. In other words, any brute force or exhaustive sweeping approach would be impractical and untenable.

In some embodiments, after each simulation or run, the design space tuning process 10 may be configured to obtain dimensional information, some of which may include, but is not limited to, eye width, eye height, etc. Normalized information may also be obtained. This information may include, but is not limited to, Normalized Jitter and Noise (NJN), Eye-Weighted bit error rate (BER), BER-Weighted Eye, etc.

Figure 8:
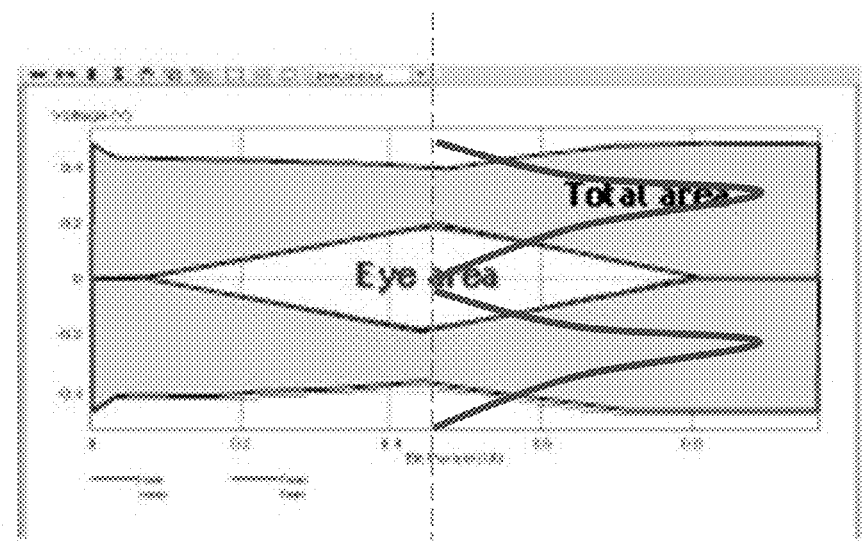
FIG. 8 is a diagram depicting an embodiment incorporating design space tuning process in accordance with the present disclosure.
Figure 9:
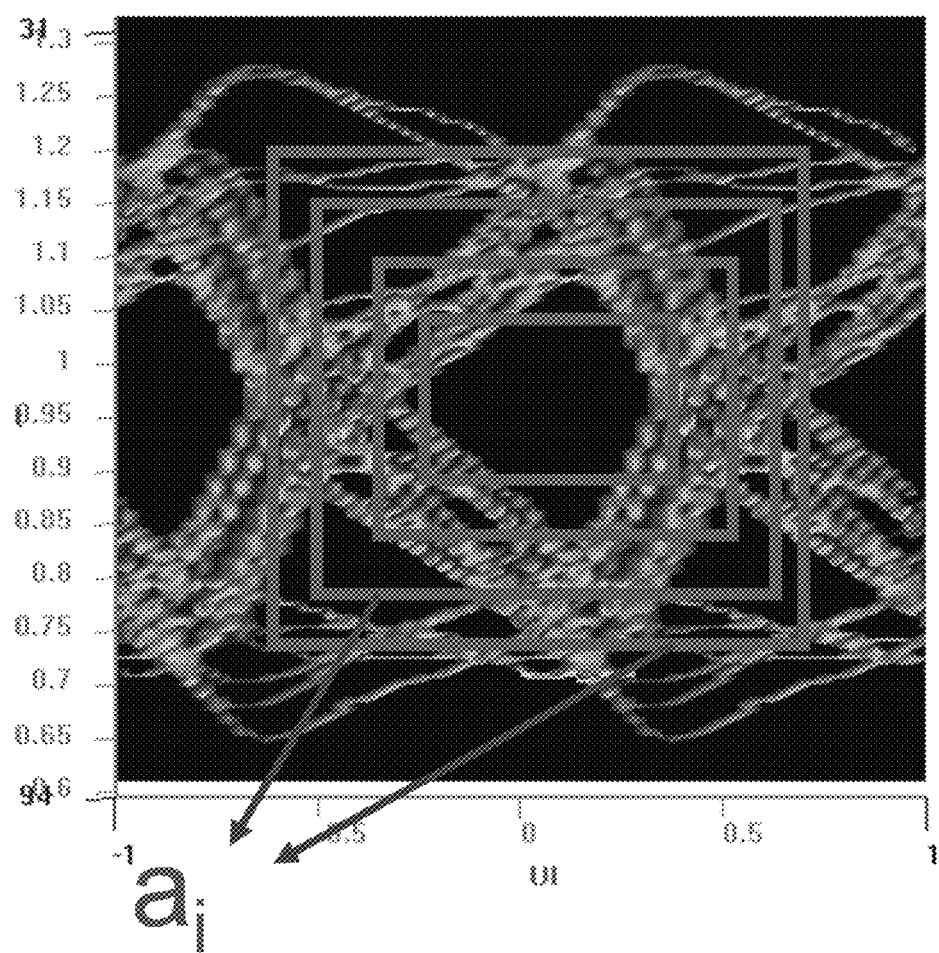
FIG. 9 is a diagram depicting an embodiment incorporating design space tuning process in accordance with the present disclosure.
Figure 10:
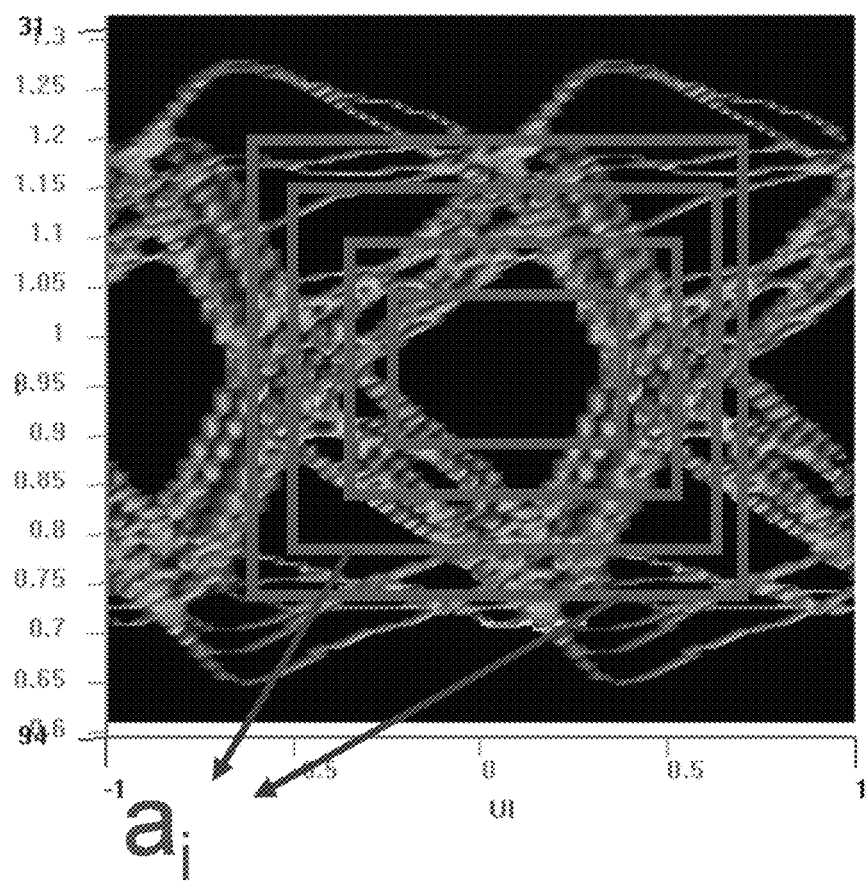
FIG. 10 is a diagram depicting an embodiment incorporating design space tuning process in accordance with the present disclosure.

Referring also to FIG. 8, a graphical user interface 800 depicting an embodiment consistent with the design space tuning process 10 is provided. This example shows a measurement metrics example for NJN. In the figure, NJN=Noise_Area/Total_Area. Similarly, Noise_Area=Total_Area−Eye Area, there NJN=1 corresponds to a fully closed eye, and NJN=0 corresponds to a fully open eye. FIGS. 9-10 show graphical user interfaces 900,1000 depicting a normalized metric, Eye-Weighted BER, wherein in FIG. 9:

$$\frac{\sum_{a_i} * BER(a_i)}{\sum_{a_i}}$$

Wherein, $a_i$—Mask area, $BER(a_i)$—Number of waveform 'hits' within the mask.

And in FIG. 10:

$$\frac{\sum_{a_i} * BER(a_i)}{\sum BER(a_i)}$$

Wherein, $a_i$—Mask area, $BER(a_i)$—Number of waveform 'hits' within the mask.

Figure 11:
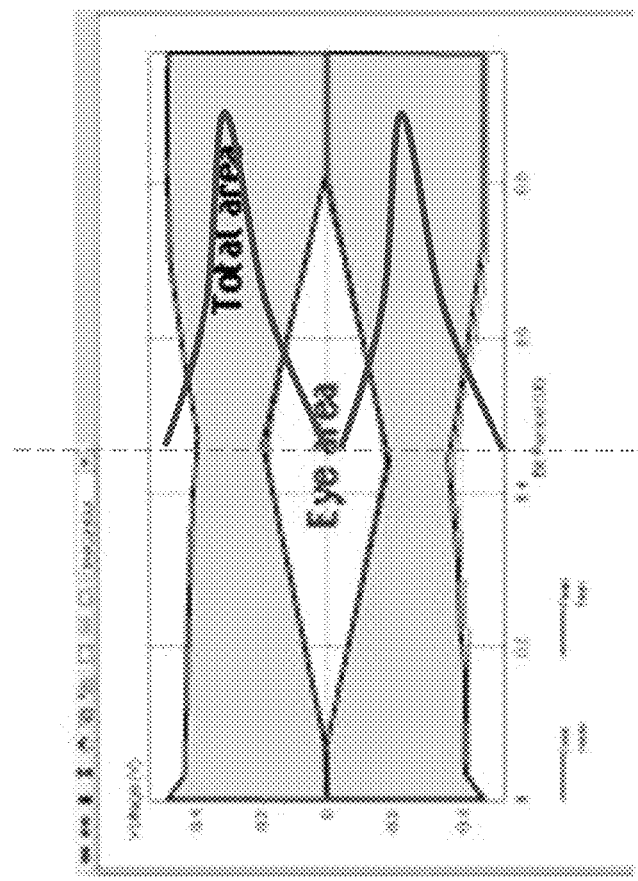
FIG. 11 is a diagram depicting an embodiment incorporating design space tuning process in accordance with the present disclosure.
Figure 11:
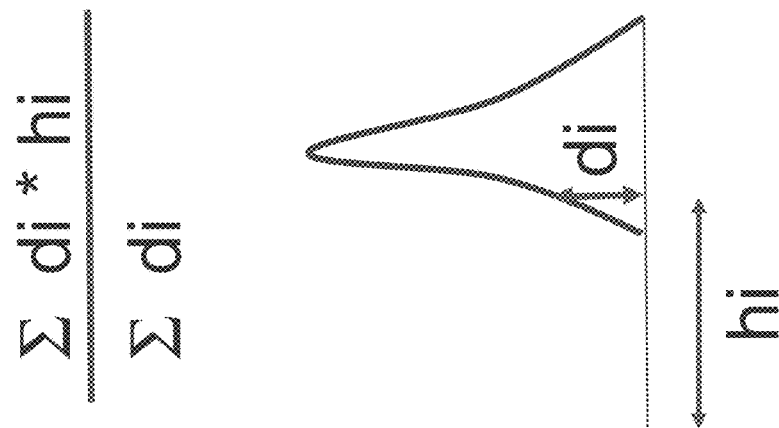

Referring also to FIG. 11, a graphical user interface 1100 depicting an embodiment consistent with the design space tuning process 10 is provided. This example shows a distribution for weighted eye height.

Figure 12:
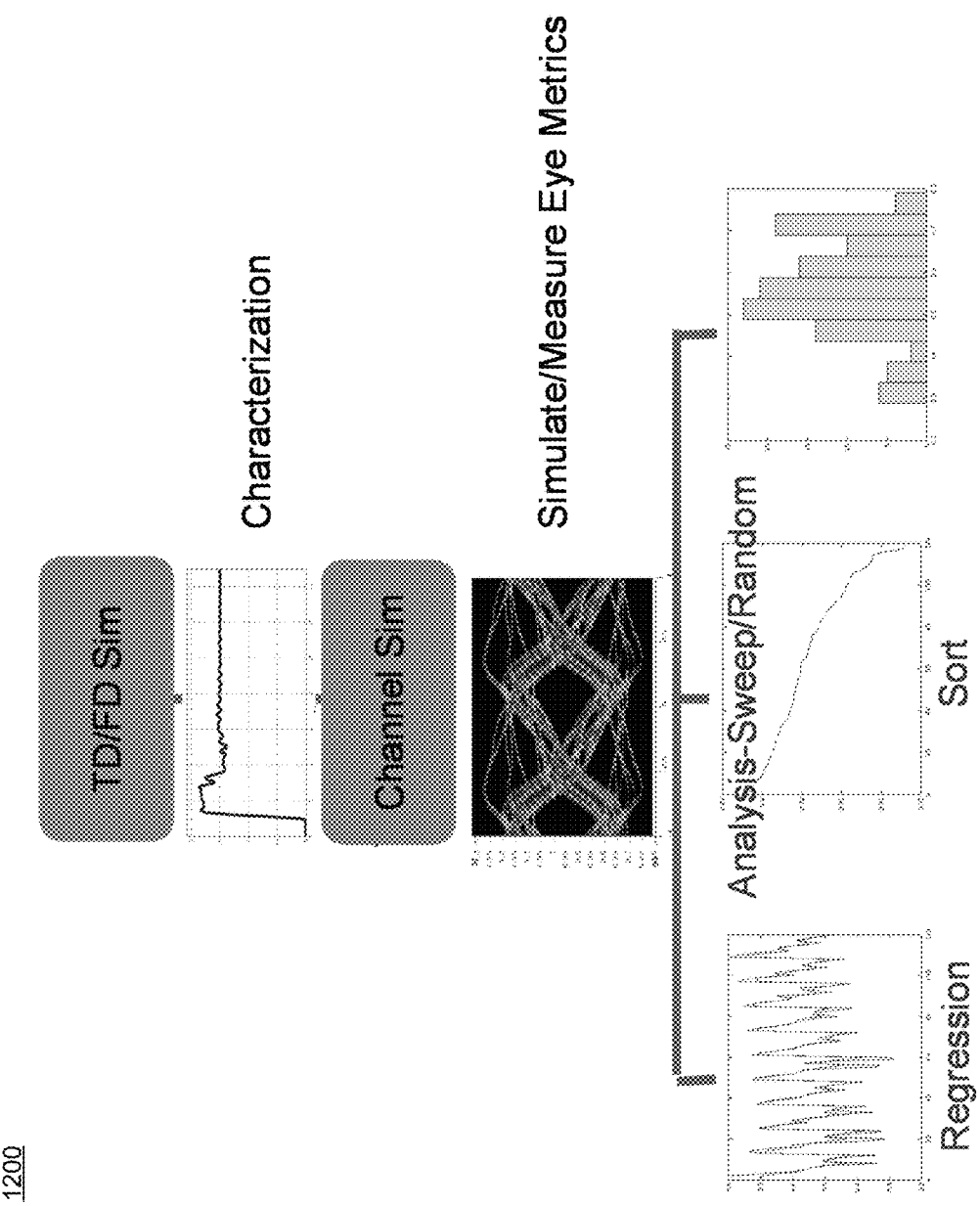
FIG. 12 is a diagram depicting an embodiment incorporating design space tuning process in accordance with the present disclosure.

Referring also to FIG. 12, a graphical user interface 1200 depicting an embodiment consistent with the design space tuning process 10 is provided. This example is similar to that shown in FIG. 3, however it also shows regression, sort, and histogram of distribution displays.

Figure 13:
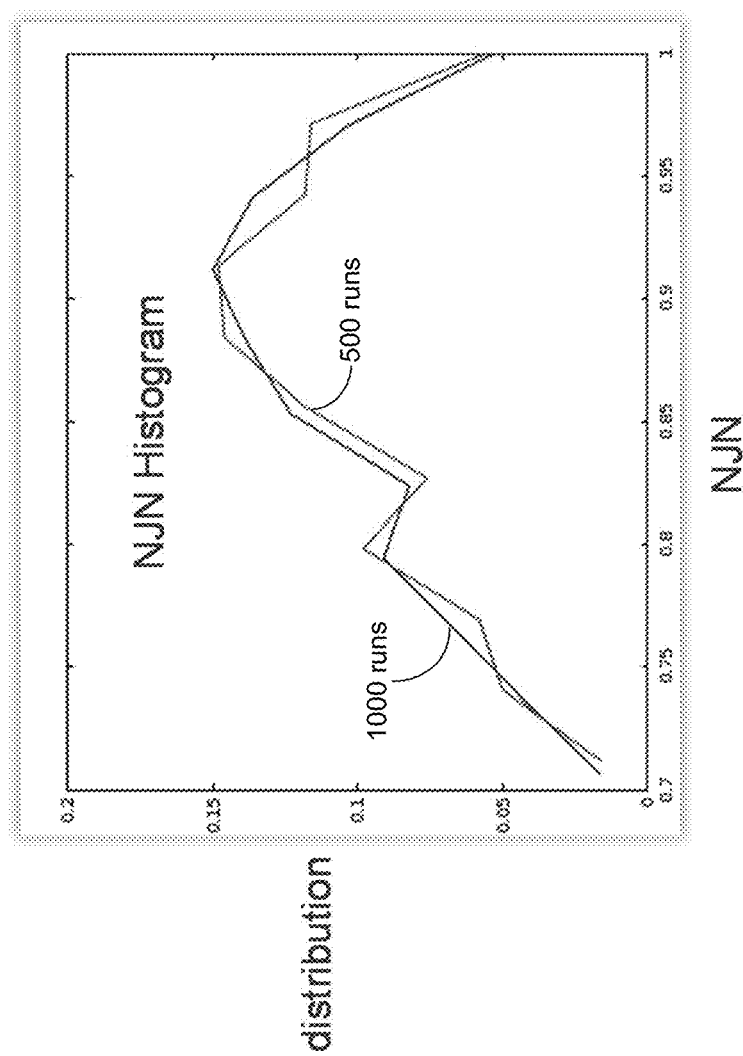
FIG. 13 is a diagram depicting an embodiment incorporating design space tuning process in accordance with the present disclosure.

Referring also to FIG. 13, a graphical user interface 1300 depicting an embodiment consistent with the design space tuning process 10 is provided. This example depicts a random runs comparison with NJN histograms. As is shown in the Figure 1000 runs and 500 runs produce comparable histograms, signifying that the number of overall runs, and hence computational time, could be reduced.

Figure 14:
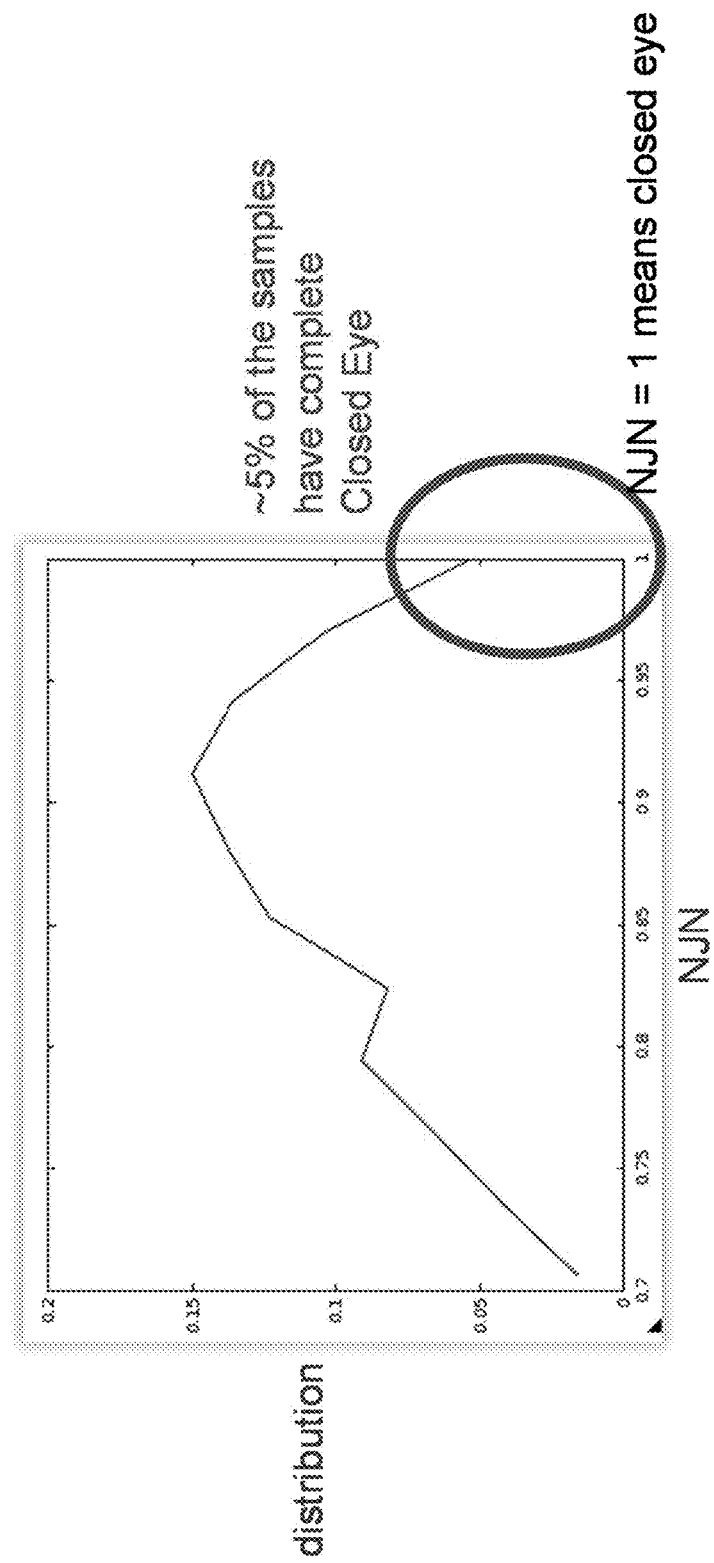
FIG. 14 is a diagram depicting an embodiment incorporating design space tuning process in accordance with the present disclosure.
Figure 15:
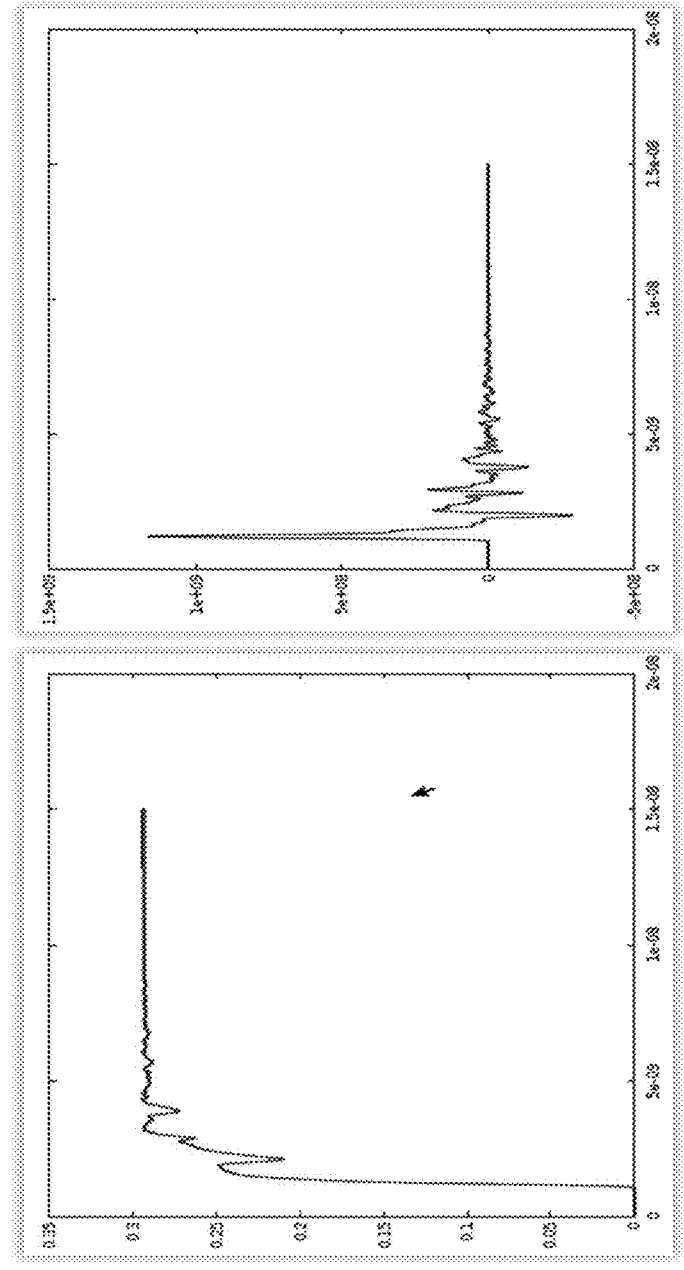
FIG. 15 is a diagram depicting an embodiment incorporating design space tuning process in accordance with the present disclosure.

Referring also to FIG. 14, a graphical user interface 1400 depicting an embodiment consistent with the design space tuning process 10 is provided. This example depicts an example where 5% of the runs have a completely closed eye. FIG. 15 depicts graphical user interfaces of the worst case step and impulse responses respectively.

Referring also to FIG. 16, an example depicting trend analysis consistent with the design space tuning process 10 is provided. In this example, the correlation metrics indicate that the capacitive and inductive parasitics of the "Pkg2" block have a significantly larger impact on the overall results, or in other words the results are much more sensitive to the Pkg2 parasitic parameters.

Figure 17:
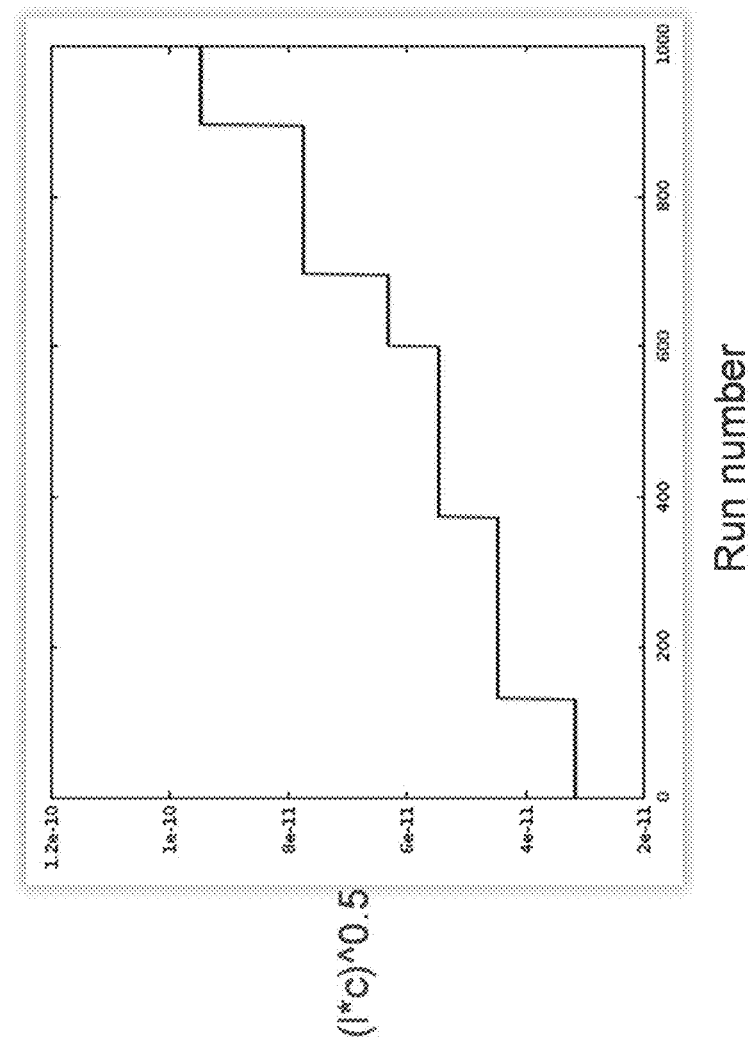
FIG. 17 is a diagram depicting an embodiment incorporating design space tuning process in accordance with the present disclosure.

Referring also to FIG. 17, a graphical user interface 1700 depicting an embodiment consistent with the design space tuning process 10 is provided. This example shows a plot of the control variable "Sqrt (pkg2_1*pkg2_c)" against the various simulation runs, which are numbered accordingly.

Figure 18:
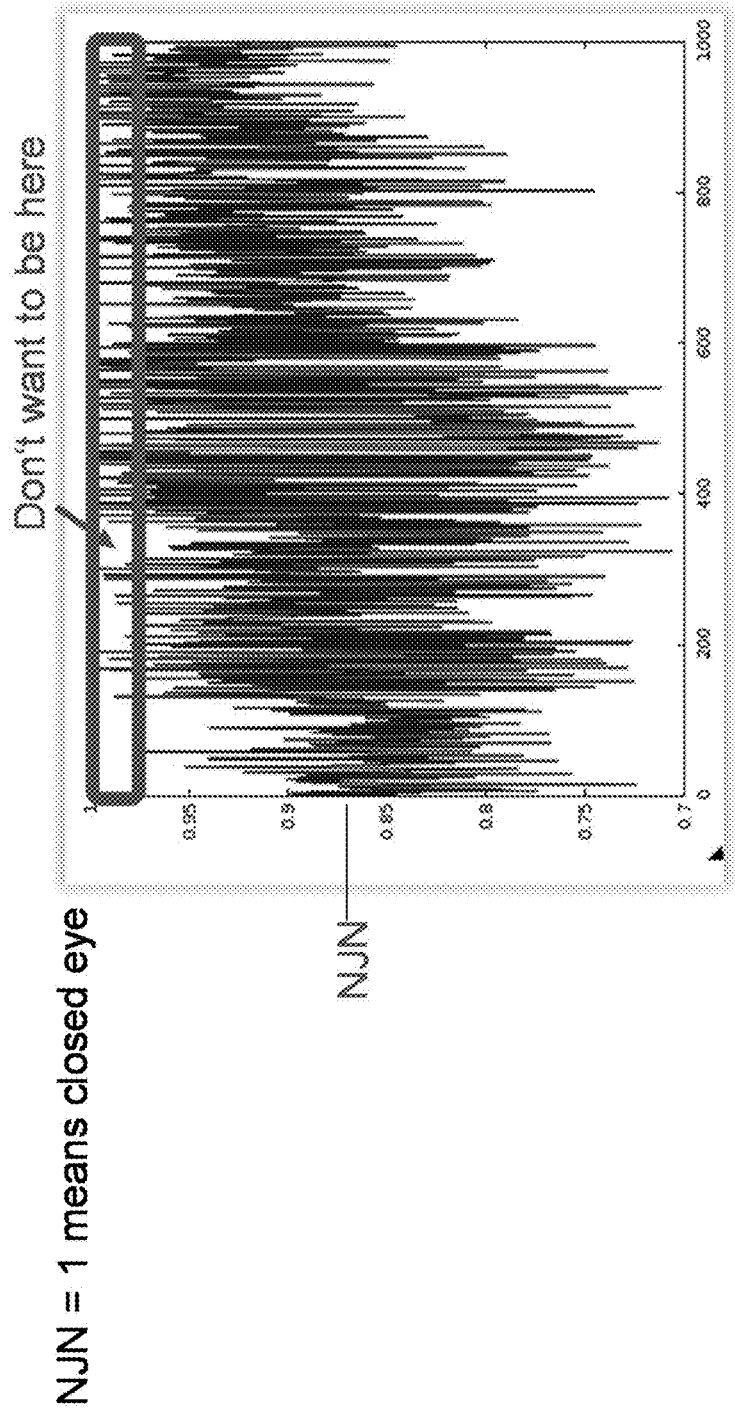
FIG. 18 is a diagram depicting an embodiment incorporating design space tuning process in accordance with the present disclosure.

Referring also to FIG. 18, a graphical user interface 1800 depicting an embodiment consistent with the design space tuning process 10 is provided. This example shows a plot of the NJN metric against the number of runs. It can be seen here that NJN quickly increases to a value approaching 1 (e.g., closed eye, which is failing).

Figure 19:
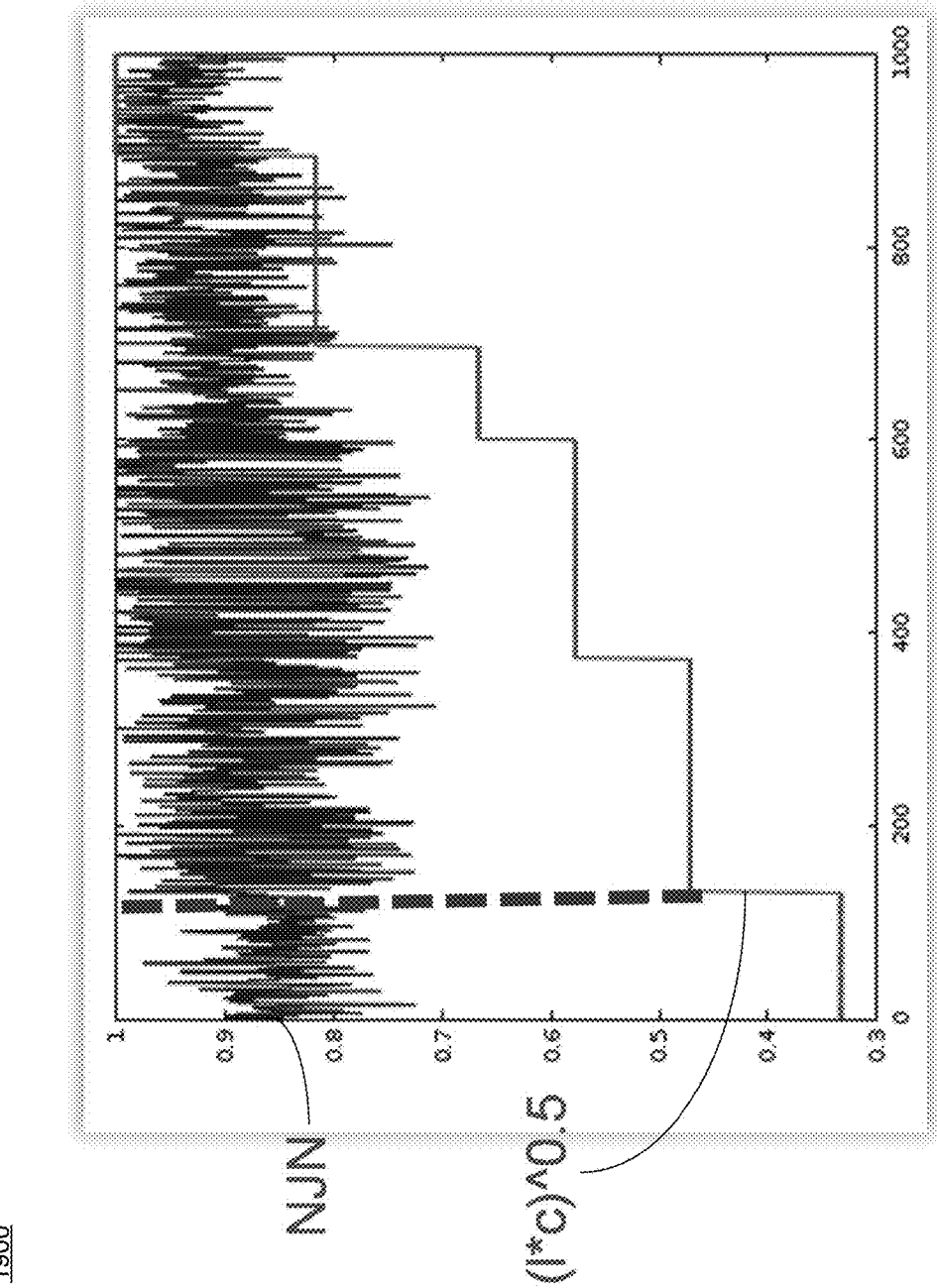
FIG. 19 is a diagram depicting an embodiment incorporating design space tuning process in accordance with the present disclosure.
Figure 20:
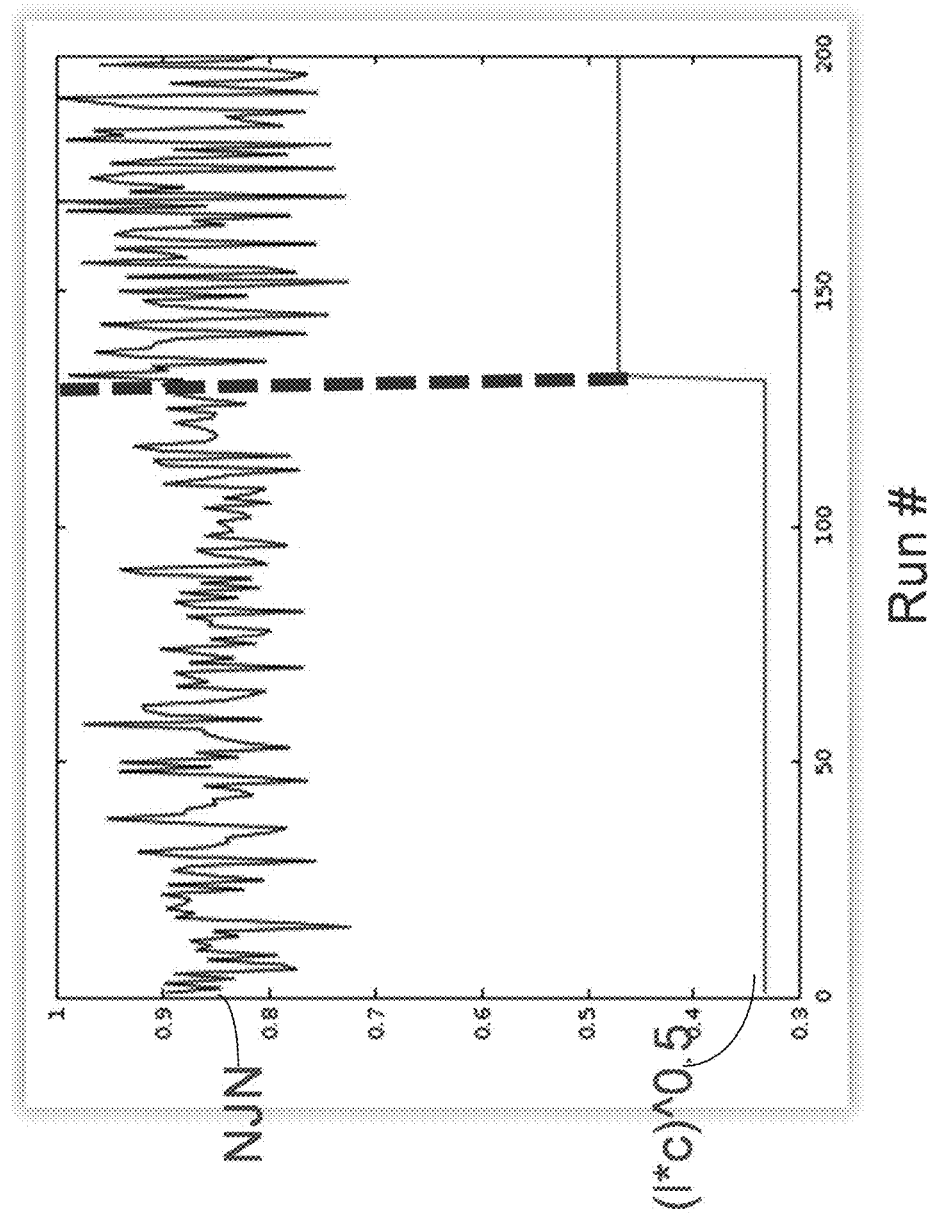
FIG. 20 is a diagram depicting an embodiment incorporating design space tuning process in accordance with the present disclosure.

Referring also to FIGS. 19-20, graphical user interfaces 1900 and 2000 depicting embodiments consistent with the design space tuning process 10 are provided. This example shows a plot of the control variable against the number of runs. Eye NJN varies with Sqrt (pkg2_1*pkg2_c) in the normalized plot. Eye NJN quickly reaches failing values of 1 as the value of Sqrt (pkg2_1*pkg2_c) increases, thus indicating that these package parasitics must be constrained in order for successful NJN metrics to be produced.

Figure 4:
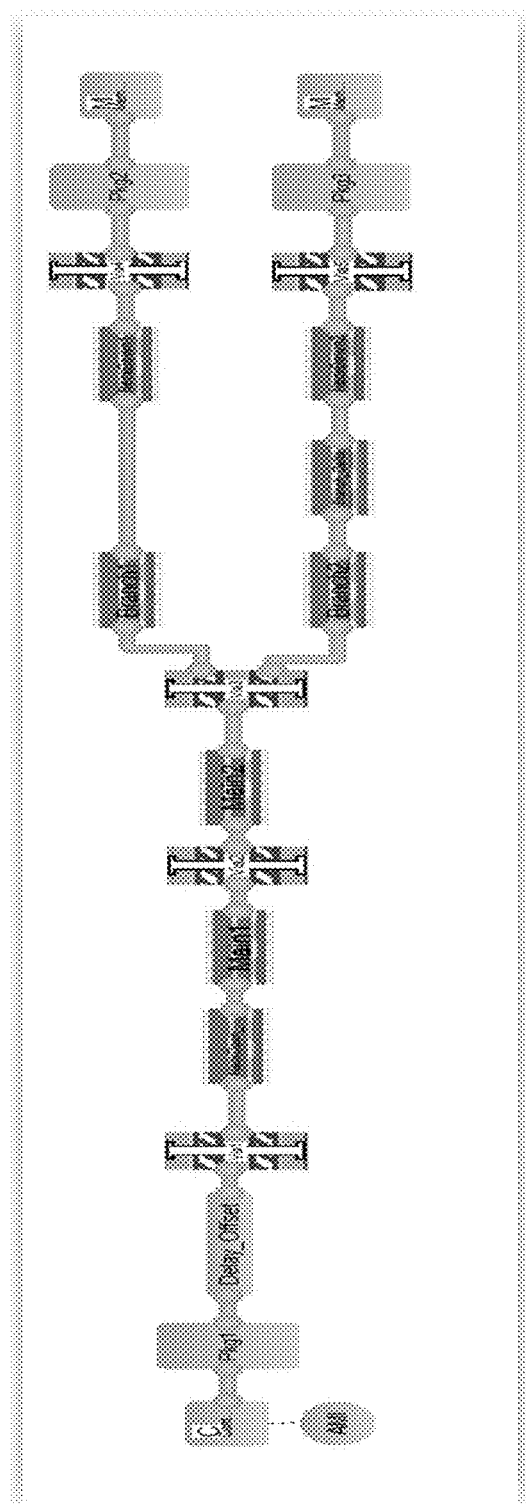
FIG. 4 is a diagram depicting an embodiment incorporating design space tuning process in accordance with the present disclosure.

Referring again to the example of FIG. 4, and based upon the figures and analysis above, the tentative conclusion here is that the package at the memory end is particularly important. For example, out of six possible combinations of L and C only one combination pkg2_cap=1p and pkg2_ind=1n will work.

Figure 21:
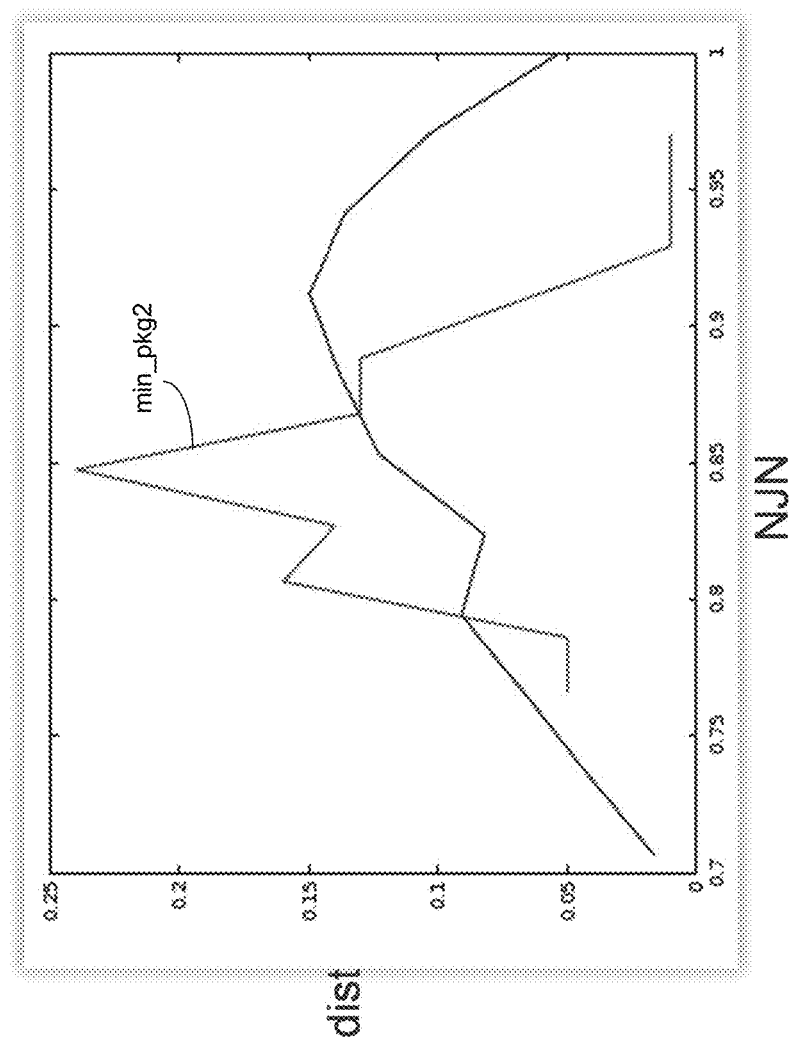
FIG. 21 is a diagram depicting an embodiment incorporating design space tuning process in accordance with the present disclosure.

Referring also to FIG. 21, a graphical user interface 2100 depicting embodiments consistent with the design space tuning process 10 are provided. This example shows a histogram comparison with min_pkg2. As can be seen in the Figure, this example shows a sharpened distribution and eliminated the problem area of NJN=1.

Figure 22:
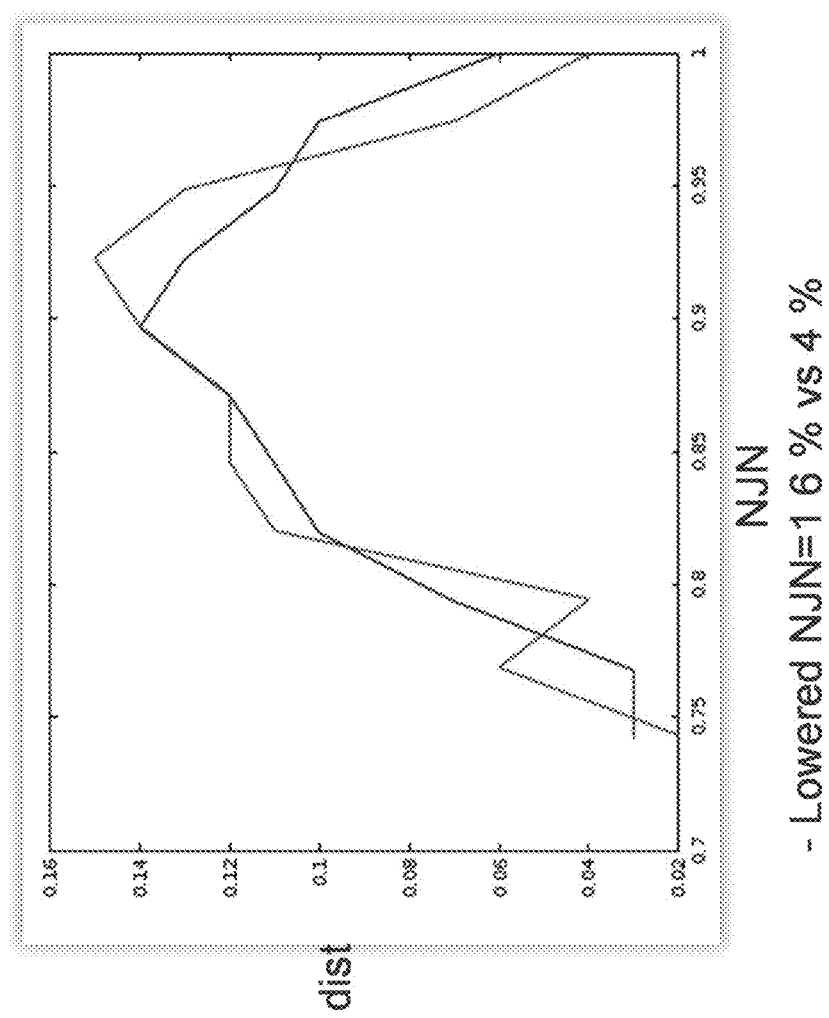
FIG. 22 is a diagram depicting an embodiment incorporating design space tuning process in accordance with the present disclosure.

Referring also to FIG. 22, a graphical user interface 2200 depicting embodiments consistent with the design space tuning process 10 are provided. This example shows the effect of an automatic 3 tap Feed Forward Equalizer (FFE) applied at the transmitter ("AMI" circle associated with the Controller "C" block depicted in FIG. 4), with no other changes to the circuit topology. As can be seen in the Figure the FFE does not solve the problem, as it is unable to overcome the numerous reflections in the system. In this example, the cases where NJN=1 was minimally impacted, reducing from 6% to 4%.

Figure 23:
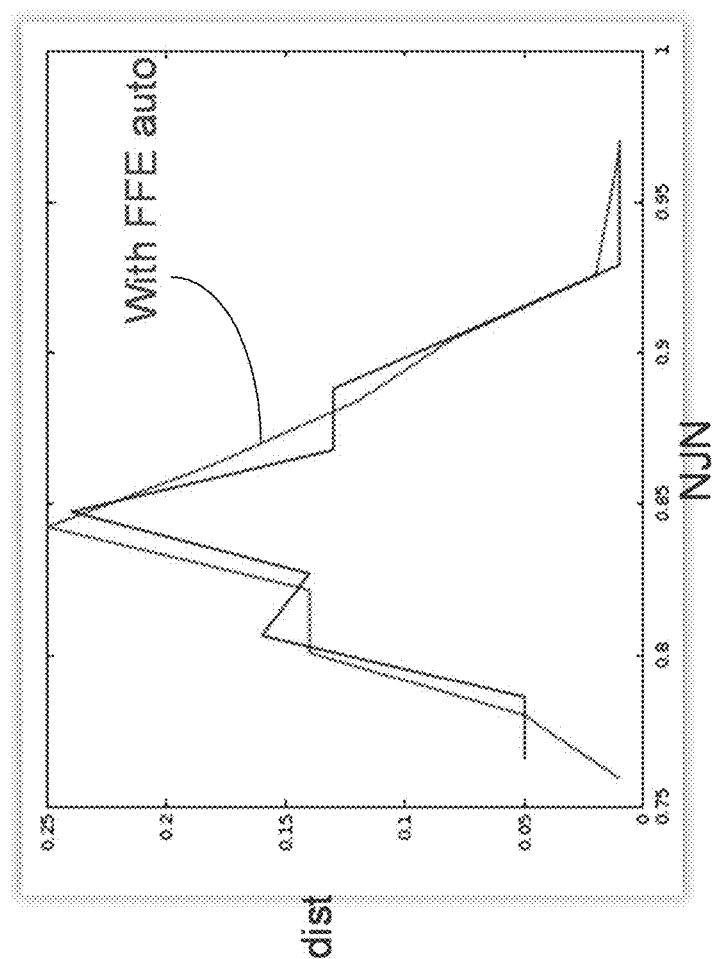
FIG. 23 is a diagram depicting an embodiment incorporating design space tuning process in accordance with the present disclosure.

Referring also to FIG. 23, a graphical user interface 2300 depicting embodiments consistent with the design space tuning process 10 are provided. This example shows results with and without FFE for the minimum package parasitic scenario. The FFE is not particularly useful in this case.

Referring also to FIG. 24, an example showing the min package parasitic trend analysis and the correlation to branch length is provided. Initial inspection shows that the variable "d3", which defines the lengths of the "branch1" and "neckdown2" transmission lines, is the most significant one.

Figure 25:
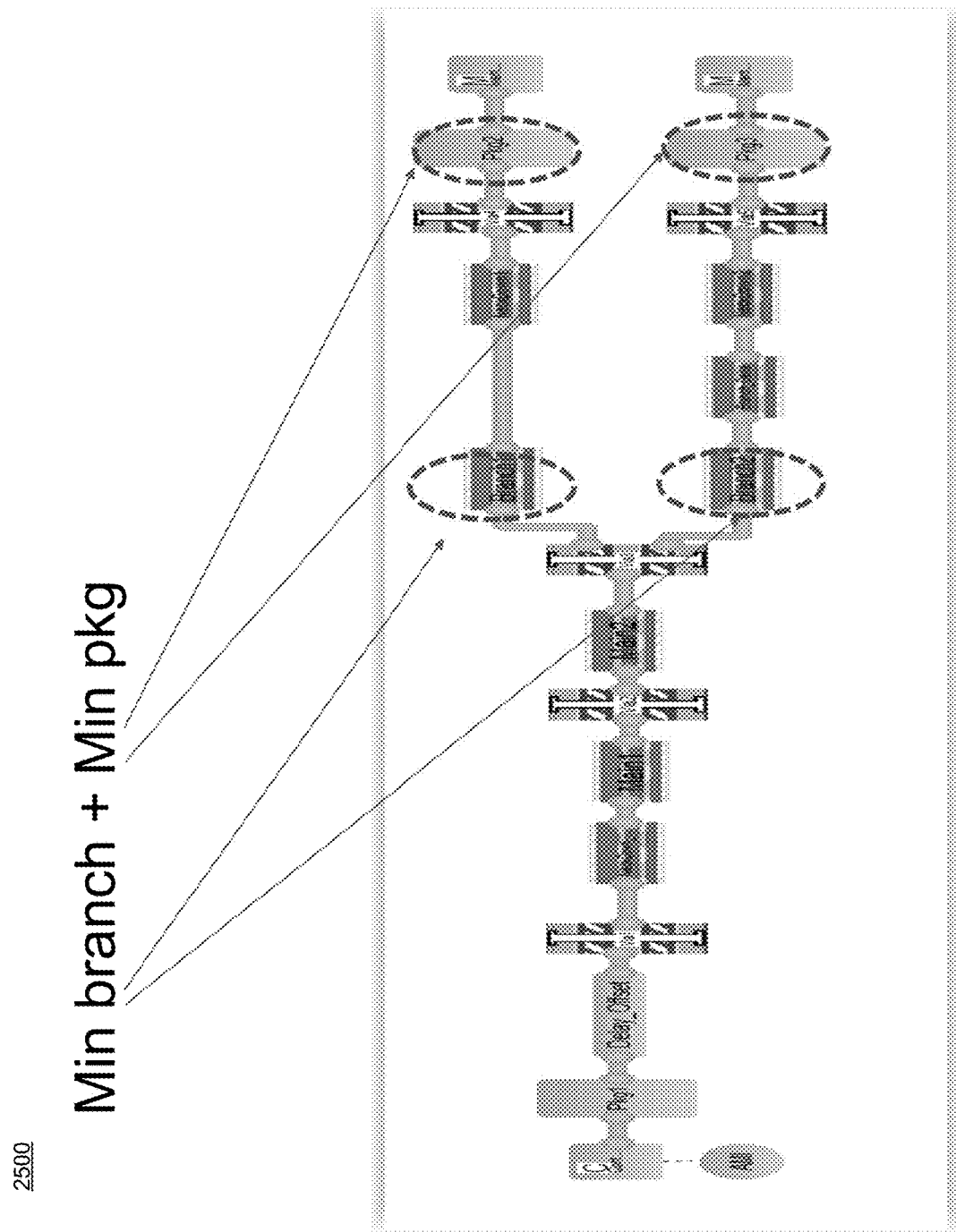
FIG. 25 is a diagram depicting an embodiment incorporating design space tuning process in accordance with the present disclosure.

Referring also to FIG. 25, a graphical user interface 2500 depicting embodiments consistent with the design space tuning process 10 are provided. This example shows a minimum branch length and a minimum package parasitic scenario similar to that shown in FIG. 4.

Figure 26:
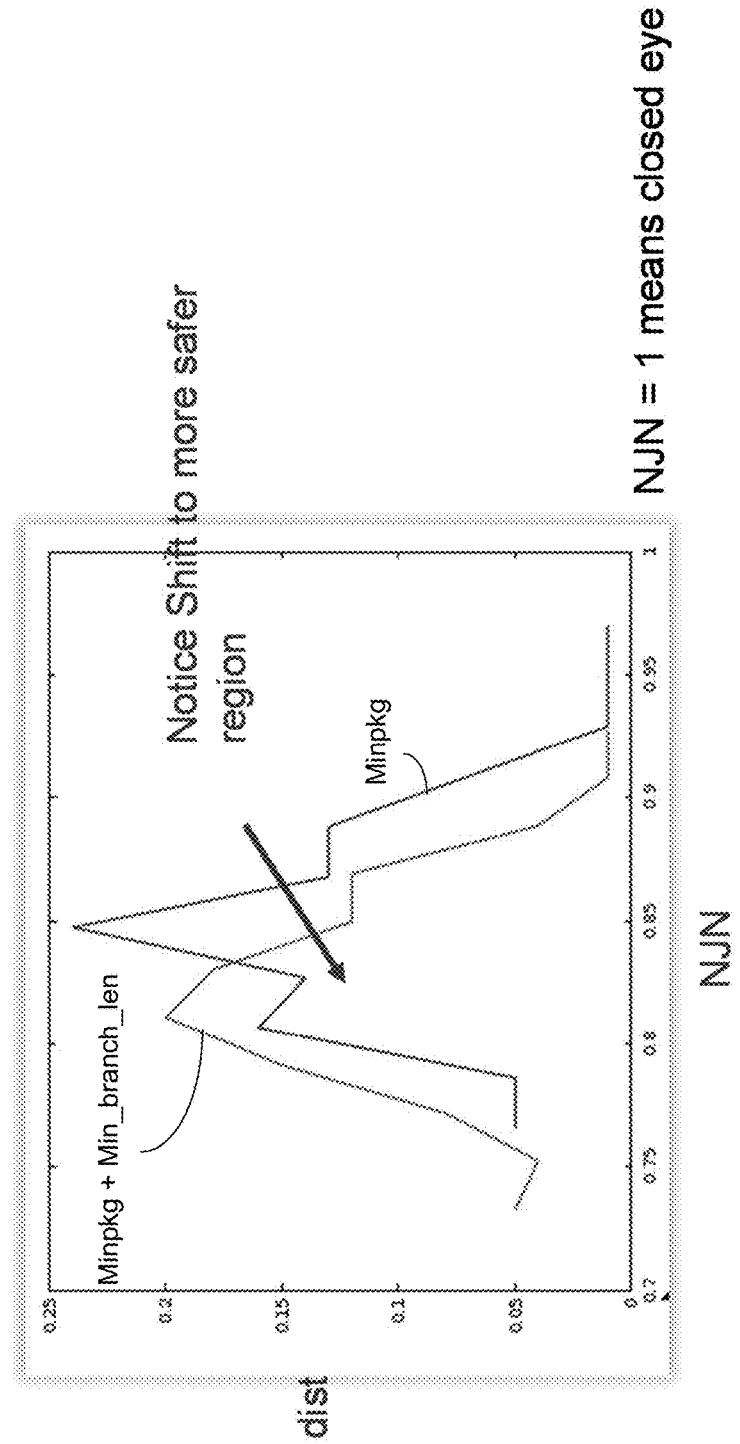
FIG. 26 is a diagram depicting an embodiment incorporating design space tuning process in accordance with the present disclosure.

Referring also to FIG. 26, a graphical user interface 2600 depicting embodiments consistent with the design space tuning process 10 are provided. This example shows two different plots, one of the minimum package case, and one of minimum package case combined with the minimum branch scenario. Note how the latter shifts the NJN distribution into a safer region of the design space.

Figure 27:
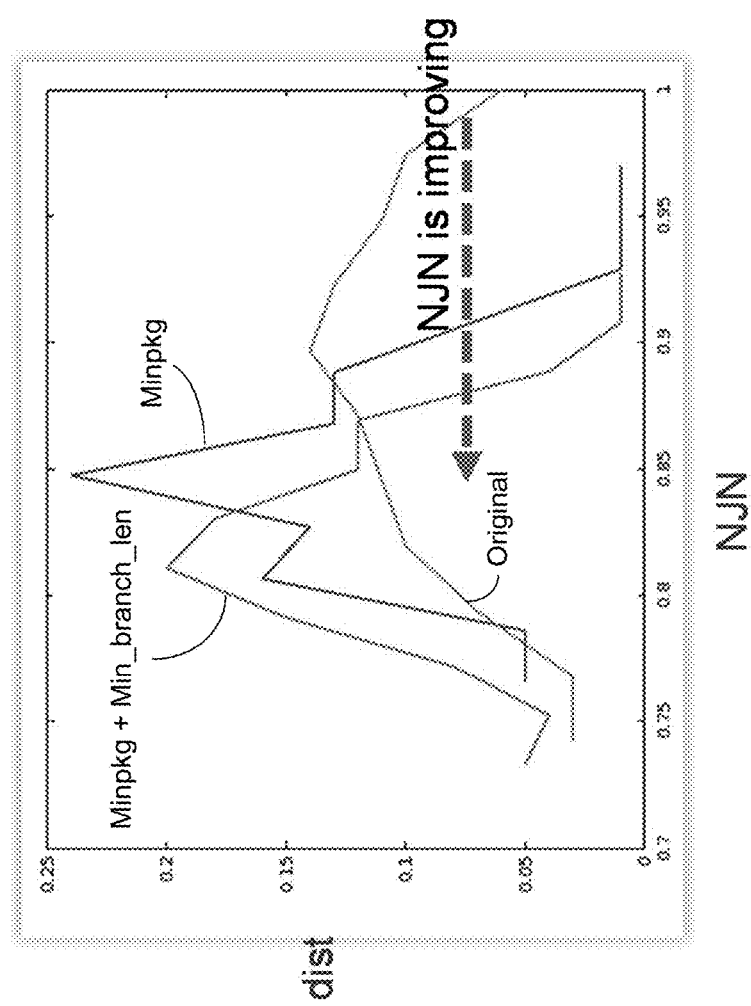
FIG. 27 is a diagram depicting an embodiment incorporating design space tuning process in accordance with the present disclosure.

Referring also to FIG. 27, a graphical user interface 2700 depicting embodiments consistent with the design space tuning process 10 are provided. This example shows three different plots; one is the original, the second is the "minpkg" case, and the third is "minpkg with min_branch_len".

Figure 28:
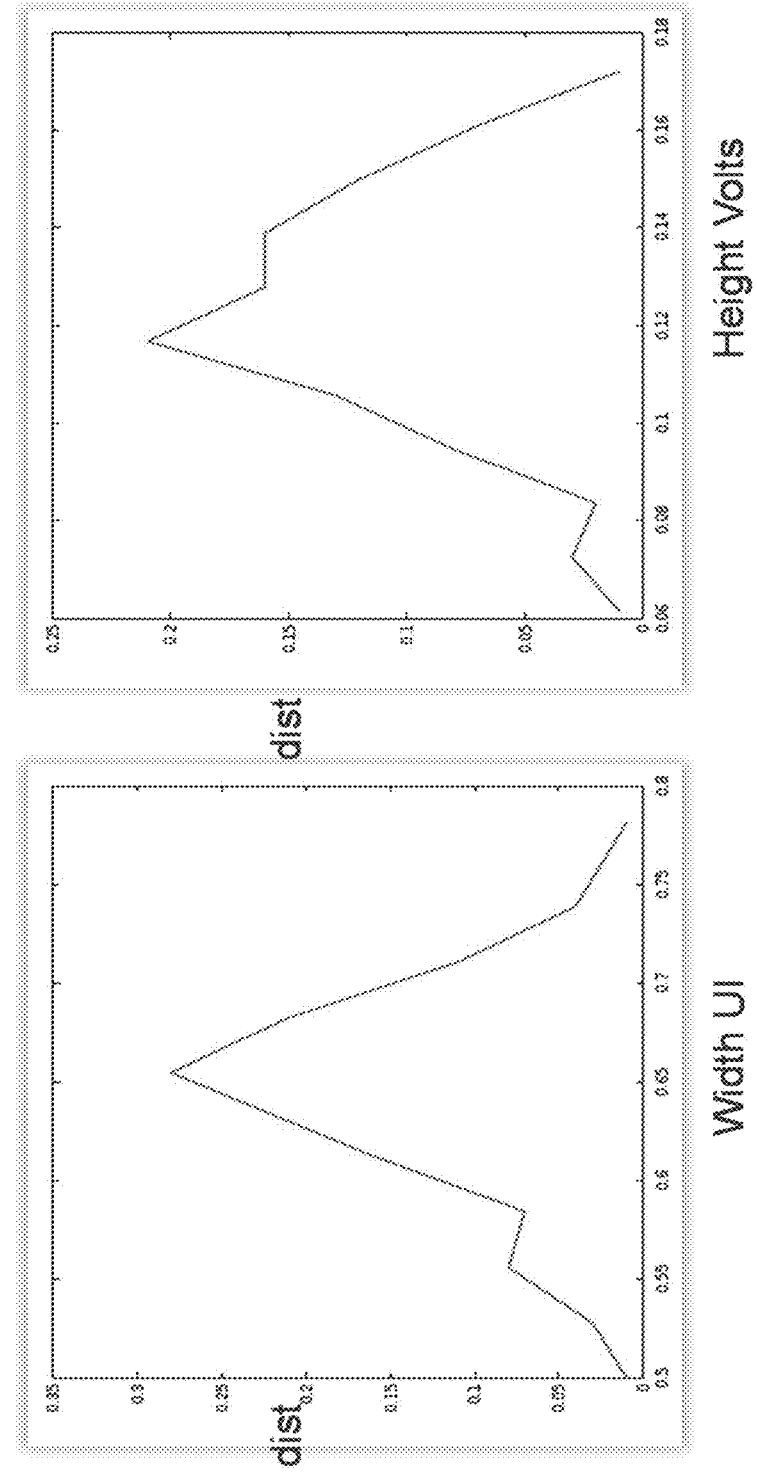
FIG. 28 is a diagram depicting an embodiment incorporating design space tuning process in accordance with the present disclosure.

Referring also to FIG. 28, a graphical user interface 2800 depicting embodiments consistent with the design space tuning process 10 are provided. This example shows two different graphs, for the recorded eye width and eye height for the "min pkg+min branch" case.

Figure 29:
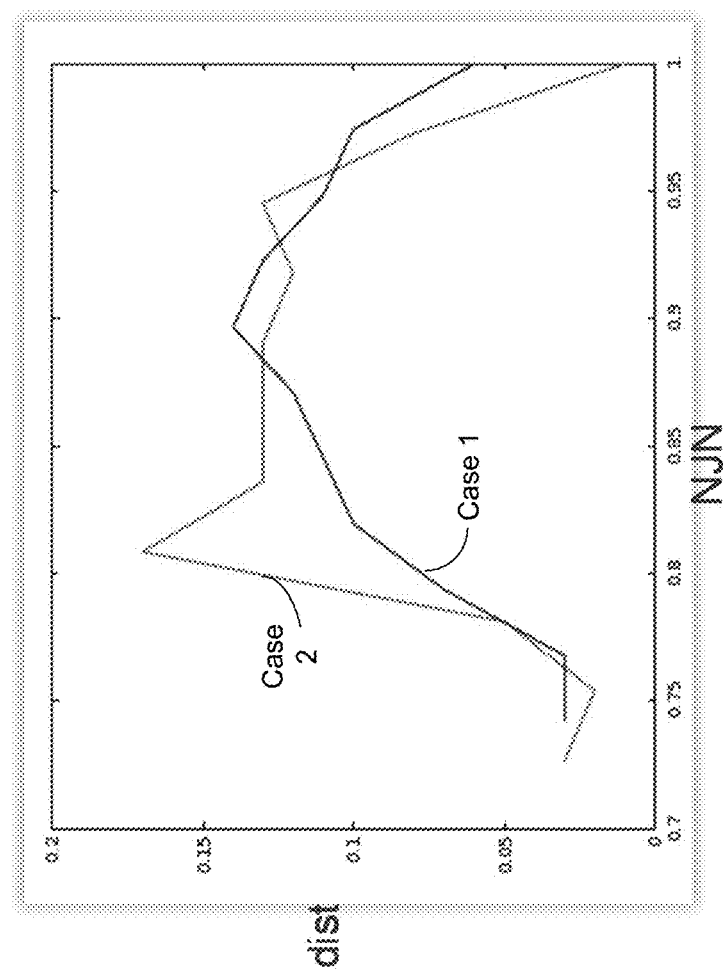
FIG. 29 is a diagram depicting an embodiment incorporating design space tuning process in accordance with the present disclosure.

In a second example, a transmitter (Tx) with a pulldown output impedance of 40 ohms (PD40), and a receiver (Rx) with 48 ohm on-die termination (48ODT) is analyzed. FIG. 29 shows a plot of this second case against the first example above.

Figure 30:
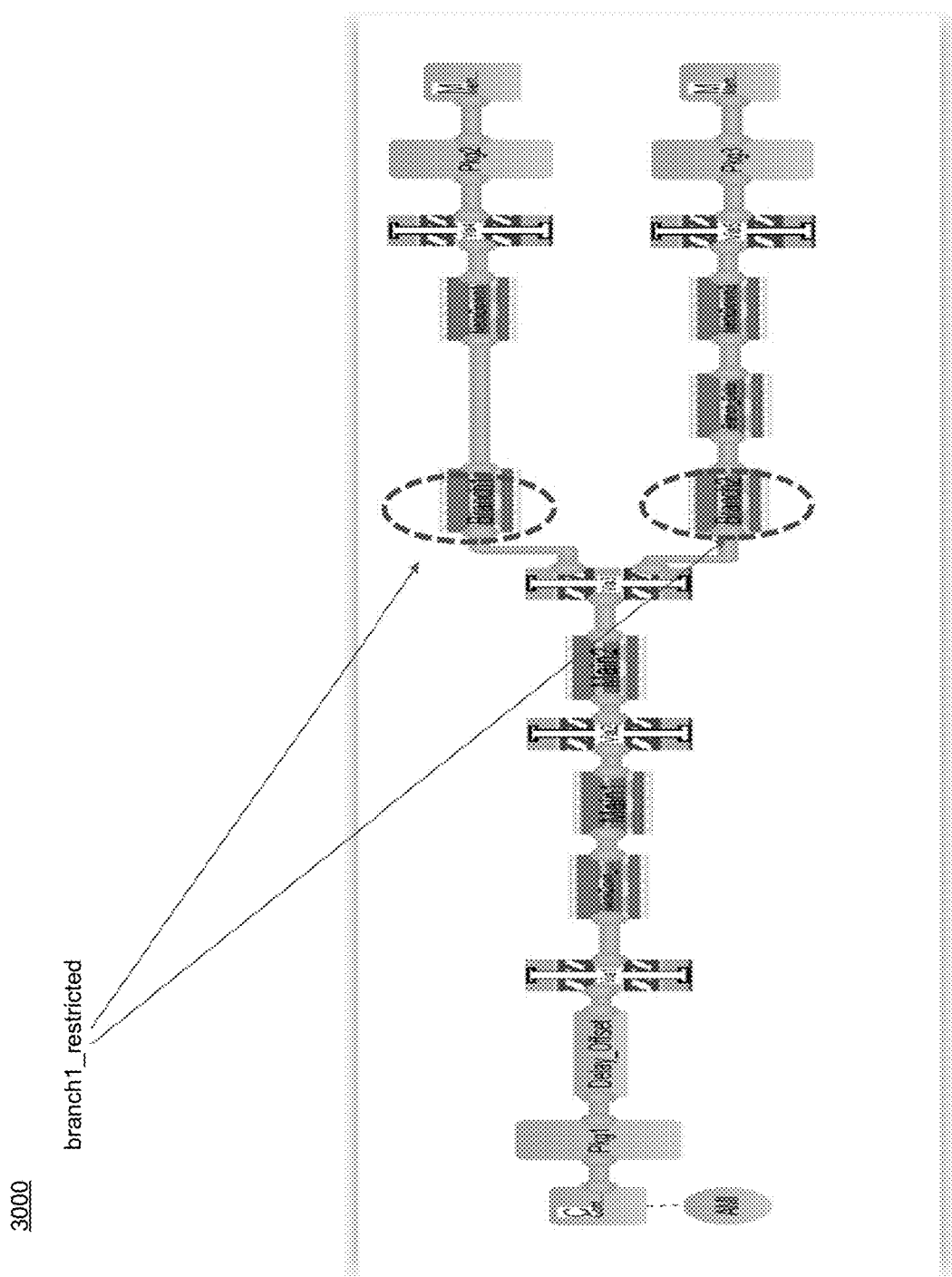
FIG. 30 is a diagram depicting an embodiment incorporating design space tuning process in accordance with the present disclosure.
Figure 31:
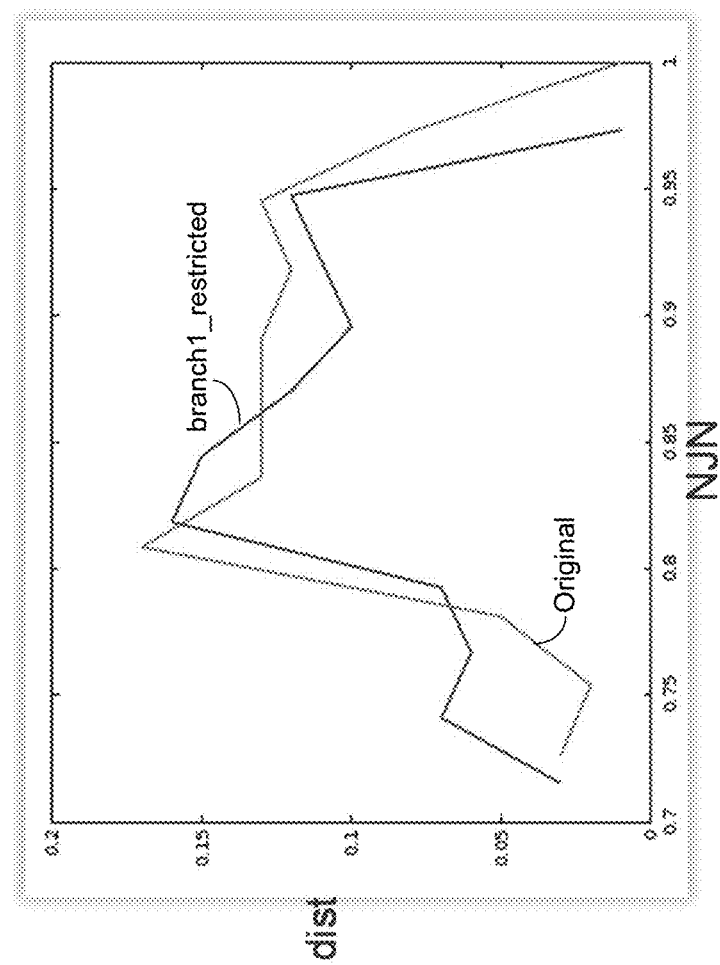
FIG. 31 is a diagram depicting an embodiment incorporating design space tuning process in accordance with the present disclosure.

Referring also to FIG. 30, a graphical user interface 3000 depicting embodiments consistent with the design space tuning process 10 are provided. This example shows branch1_restricted. FIG. 31 shows a plot of the original vs branch1_restricted.

Figure 32:
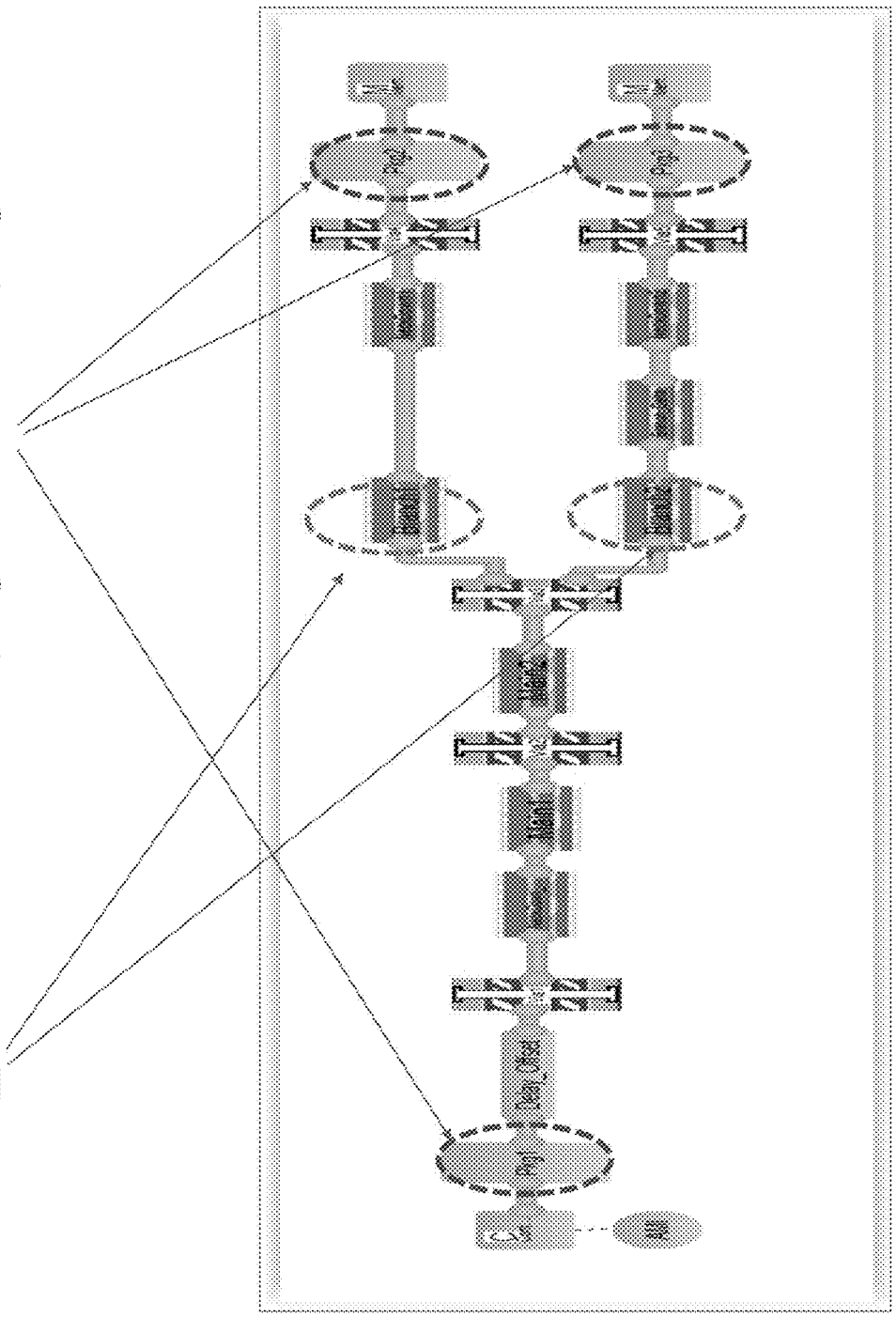
FIG. 32 is a diagram depicting an embodiment incorporating design space tuning process in accordance with the present disclosure.

Referring also to FIG. 32, a graphical user interface 3200 depicting embodiments consistent with the design space tuning process 10 are provided. This example shows an example of branch1_restricted+Min pkg1 and min pkg2.

Figure 33:
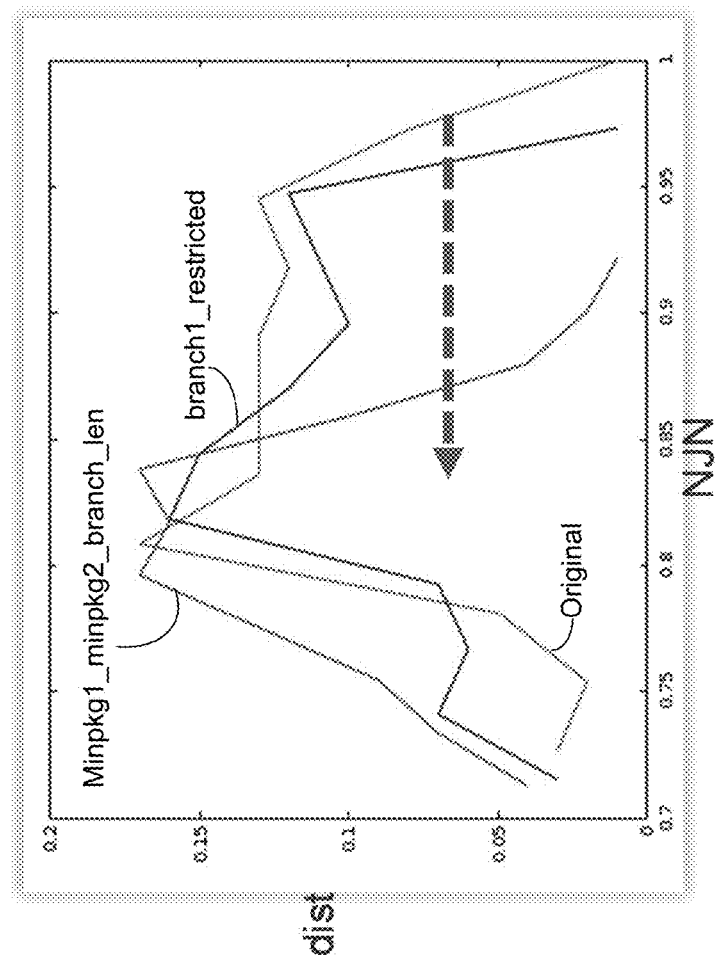
FIG. 33 is a diagram depicting an embodiment incorporating design space tuning process in accordance with the present disclosure.

Referring also to FIG. 33, a graphical user interface 3000 depicting embodiments consistent with the design space tuning process 10 are provided. This example shows three plots, namely the original, the branch1_restricted, and the minpkg1_minpkg2_branch_len plots.

Embodiments of the design space tuning process 10 may use the characteristic distribution to obtain the desired results. Accordingly, the goal is to select parameters which narrows/sharpens the distribution (e.g., smaller standard deviation). In the particular example provided above the action is near the receiver (e.g., memory) and the memory package is the key influencer, while the branch lengths are the next key parameters As discussed above, embodiments of the design space tuning process 10 may include providing (202), using at least one processor, an electronic design and modeling (204) the electronic design to obtain a characteristic distribution associated with the electronic design, wherein modeling includes randomly varying one or more parameters associated with the electronic design. The method may further include identifying (206) at least one key parameter from the modeled electronic design and constricting (208) the electronic design only to the at least one key parameter. The method may also include randomly varying (210) the one or more parameters and re-modeling (212) the constricted electronic design with the randomly varied one or more parameters.

In some embodiments, the re-modeling may be recursive based on user-desired generations and constraints. In this way, the re-modeling runs enough generations to meet the constraints (e.g., re-modeling can continue for 5 to 6 generations or stop at a max value as entered by the user). The method may further include obtaining a second (or more as described above) characteristic distribution associated with the re-modeling. The method may include displaying the characteristic distribution at a graphical user interface. The method may also include displaying a second (or more as described above) characteristic distribution at the graphical user interface. In some embodiments, identifying the at least one key parameter from the modeled electronic design may include identifying one or more most dominant variables from post processing data. In some embodiments, the post-processing may be cross-correlation (or least square model or other). In some embodiments, the one or more parameters may include at least one of data rate information, transmitter information, receiver information, package parasitic information, via parasitic information, main and branch trace length information, main and branch trace width information, and main and branch trace height information. Embodiments may further include comparing the characteristic distribution of a dependent variable (e.g. normalized jitter noise) value. The process may be complete when the desired criteria for the characteristic distribution has been met.

Embodiments of the design space tuning process 10 may allow a user to predict that a particular component is the most important parameter in the system and needs attention in its design with a high degree of accuracy. The user may reduce the number of possible runs to analyze the system from millions to a very manageable thousands or even hundreds.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A method for use with an electronic circuit design comprising:
   providing, using at least one processor, an electronic design;
   modeling the electronic design to obtain a characteristic distribution associated with the electronic design, wherein modeling includes randomly varying one or more parameters associated with the electronic design;
   identifying at least one key parameter from the modeled electronic design, wherein identifying the at least one key parameter from the modeled electronic design includes identifying, ranking, and displaying the at least one key parameter based upon importance;
   reducing the electronic design only to the at least one key parameter;
   in response to reducing, randomly varying the one or more parameters; and
   re-modeling the reduced electronic design with the randomly varied one or more parameters.

2. The method of claim 1, further comprising:
   obtaining a second characteristic distribution associated with the re-modeling.

3. The method of claim 1, further comprising:
   displaying the characteristic distribution at a graphical user interface.

4. The method of claim 3, further comprising:
   displaying a second characteristic distribution at the graphical user interface.

5. The method of claim 1, wherein the one or more parameters includes at least one of data rate information, transmitter information, receiver information, package parasitic information, via parasitic information, main and branch trace length information, main and branch trace width information, and main and branch trace height information.

6. The method of claim 3, further comprising:
   comparing the characteristic distribution to a normalized jitter noise value.

7. A non-transitory computer readable storage medium having stored thereon instructions, which when executed by a process result in one or more operations, the operations comprising:
   providing, using at least one processor, an electronic design;
   modeling the electronic design to obtain a characteristic distribution associated with the electronic design, wherein modeling includes randomly varying one or more parameters associated with the electronic design;
   identifying at least one key parameter from the modeled electronic design, wherein identifying the at least one key parameter from the modeled electronic design includes identifying, ranking, and displaying the at least one key parameter based upon importance;
   reducing the electronic design only to the at least one key parameter;
   in response to reducing, randomly varying the one or more parameters; and
   re-modeling the reduced electronic design with the randomly varied one or more parameters.

8. The non-transitory computer readable storage medium of claim 7, further comprising:
   obtaining a second characteristic distribution associated with the re-modeling.

9. The non-transitory computer readable storage medium of claim 7, further comprising:
   displaying the characteristic distribution at a graphical user interface.

10. The non-transitory computer readable storage medium of claim 9, further comprising:
    displaying a second characteristic distribution at the graphical user interface.

11. The non-transitory computer readable storage medium of claim 7, wherein the one or more parameters includes at least one of data rate information, transmitter information, receiver information, package parasitic information, via parasitic information, main and branch trace length information, main and branch trace width information, and main and branch trace height information.

12. The non-transitory computer readable storage medium of claim 9, further comprising:
    comparing the characteristic distribution to a normalized jitter noise value.

13. A system for use in an electronic circuit design comprising:
    a computing device having at least one processor configured to receive an electronic design and model the electronic design to obtain a characteristic distribution associated with the electronic design, wherein modeling includes randomly varying one or more parameters associated with the electronic design, the at least one processor further configured to identify at least one key parameter from the modeled electronic design, wherein identifying the at least one key parameter from the modeled electronic design includes identifying, ranking, and displaying the at least one key parameter based upon importance, the at least one processor further configured to reduce the electronic design only to the at least one key parameter and in response to reducing, to randomly vary the one or more parameters, the at least one processor further configured to re-model the reduced electronic design with the randomly varied one or more parameters.

14. The system of claim 13, wherein the at least one processor is further configured to obtain a second characteristic distribution associated with the re-modeling.

15. The system of claim 13, wherein the at least one processor is further configured to display the characteristic distribution at a graphical user interface.

16. The system of claim 15, wherein the at least one processor is further configured to display a second characteristic distribution at the graphical user interface.

17. The system of claim 13, wherein the one or more parameters includes at least one of data rate information, transmitter information, receiver information, package parasitic information, via parasitic information, main and branch trace length information, main and branch trace width information, and main and branch trace height information.

* * * * *